(12) United States Patent
Camm et al.

(10) Patent No.: US 8,454,356 B2
(45) Date of Patent: Jun. 4, 2013

(54) SYSTEMS AND METHODS FOR SUPPORTING A WORKPIECE DURING HEAT-TREATING

(75) Inventors: David Malcolm Camm, Vancouver (CA); Joseph Cibere, Burnaby (CA); Mladen Bumbulovic, Vancouver (CA)

(73) Assignee: Mattson Technology, Inc., Fremont, CA (US)

( * ) Notice: Subject to any disclaimer, the term of this patent is extended or adjusted under 35 U.S.C. 154(b) by 1121 days.

(21) Appl. No.: 11/940,983

(22) Filed: Nov. 15, 2007

(65) Prior Publication Data

US 2008/0157452 A1 Jul. 3, 2008

Related U.S. Application Data

(60) Provisional application No. 60/858,946, filed on Nov. 15, 2006.

(51) Int. Cl.
*F27D 5/00* (2006.01)

(52) U.S. Cl.
USPC ........................................ 432/253; 219/443.1

(58) Field of Classification Search
USPC ................ 269/55; 156/345.51; 432/253, 258; 219/443.1
See application file for complete search history.

(56) References Cited

U.S. PATENT DOCUMENTS

| | | |
|---|---|---|
| 1,587,023 A | 6/1926 | Mottlau |
| RE24,296 E | 3/1957 | Stewart |
| 2,981,819 A | 4/1961 | Gregory |
| 3,047,438 A | 7/1962 | Marinace |
| 3,108,173 A | 10/1963 | Barrett et al. |
| 3,160,517 A | 12/1964 | Jenkin |
| 3,213,827 A | 10/1965 | Jenkin |
| 3,227,065 A | 1/1966 | Litman |
| 3,239,651 A | 3/1966 | Silberman |
| 3,240,915 A | 3/1966 | Carter et al. |
| 3,460,510 A | 8/1969 | Currin |
| 3,502,516 A | 3/1970 | Henker |
| 3,610,613 A | 10/1971 | Worden .................. 269/254 |
| 3,623,712 A | 11/1971 | McNeilly et al. |

(Continued)

FOREIGN PATENT DOCUMENTS

| | | |
|---|---|---|
| CA | 2 339 359 | 2/2000 |
| DE | 42 23 133 | 1/1993 |

(Continued)

OTHER PUBLICATIONS

Combined International Search Report and Written Opinion for commonly owned PCT application No. PCT/CA2007/002070 (publication No. WO 2008/058397).

(Continued)

*Primary Examiner* — Gregory A Wilson
(74) *Attorney, Agent, or Firm* — Knobbe, Martens, Olson & Bear LLP

(57) ABSTRACT

An apparatus for supporting a workpiece during heat-treating includes a support plate having a non-planar upper surface, and a support system. The support system is configured to support the workpiece above the support plate during heat-treating of the workpiece, such that a lower surface of an initial shape of the workpiece is supported at a non-uniform spacing above the non-planar upper surface of the support plate, said non-uniform spacing including an edge gap beneath an outer perimeter of the workpiece, and a central gap at a central axis of the workpiece.

45 Claims, 11 Drawing Sheets

U.S. PATENT DOCUMENTS

| | | |
|---|---|---|
| 3,627,590 A | 12/1971 | Mammel |
| 3,661,637 A | 5/1972 | Sirtl |
| 3,692,572 A | 9/1972 | Strehlow |
| 3,700,850 A | 10/1972 | Lumley et al. |
| 3,836,751 A | 9/1974 | Anderson |
| 3,913,872 A | 10/1975 | Weber |
| 4,027,185 A | 5/1977 | Nodwell et al. |
| 4,041,278 A | 8/1977 | Boah |
| 4,081,313 A | 3/1978 | McNeilly et al. |
| 4,097,226 A | 6/1978 | Erikson et al. |
| 4,101,759 A | 7/1978 | Anthony et al. |
| 4,115,163 A | 9/1978 | Gorina et al. |
| 4,122,240 A | 10/1978 | Banas et al. |
| 4,151,008 A | 4/1979 | Kirkpatrick |
| 4,164,643 A | 8/1979 | Peart et al. |
| 4,220,483 A | 9/1980 | Cazcarra |
| 4,224,096 A | 9/1980 | Osborne |
| 4,233,493 A | 11/1980 | Nath |
| 4,306,731 A | 12/1981 | Shaw |
| 4,308,078 A | 12/1981 | Cook |
| 4,315,130 A | 2/1982 | Inagaki et al. |
| 4,331,485 A | 5/1982 | Gat |
| 4,356,384 A | 10/1982 | Gat |
| 4,370,175 A | 1/1983 | Levatter |
| 4,375,993 A | 3/1983 | Mori et al. |
| 4,379,727 A | 4/1983 | Hansen et al. |
| 4,398,094 A | 8/1983 | Hiramoto |
| 4,421,048 A | 12/1983 | Adema et al. |
| 4,431,459 A | 2/1984 | Teng |
| 4,455,479 A | 6/1984 | Itoh et al. |
| 4,457,359 A * | 7/1984 | Holden ................. 165/80.5 |
| 4,482,393 A | 11/1984 | Nishiyama et al. |
| 4,493,977 A | 1/1985 | Arai et al. |
| 4,504,323 A | 3/1985 | Arai et al. |
| 4,533,820 A * | 8/1985 | Shimizu ................. 219/411 |
| 4,539,431 A | 9/1985 | Moddel et al. |
| 4,540,876 A | 9/1985 | McGinty |
| 4,550,245 A | 10/1985 | Arai et al. |
| 4,550,684 A | 11/1985 | Mahawili |
| 4,560,420 A | 12/1985 | Lord ..................... 148/1.5 |
| 4,567,352 A | 1/1986 | Mimura et al. |
| 4,581,520 A | 4/1986 | Vu et al. |
| 4,636,969 A | 1/1987 | Kyoden et al. |
| 4,649,241 A | 3/1987 | Young et al. |
| 4,649,261 A | 3/1987 | Sheets |
| 4,661,177 A | 4/1987 | Powell |
| 4,682,594 A | 7/1987 | Mok |
| 4,698,486 A | 10/1987 | Sheets |
| 4,700,102 A | 10/1987 | Camm et al. |
| 4,751,193 A | 6/1988 | Myrick |
| 4,755,654 A | 7/1988 | Crowley et al. |
| 4,787,551 A | 11/1988 | Hoyt et al. |
| 4,794,619 A | 12/1988 | Tregay |
| 4,818,327 A | 4/1989 | Davis et al. |
| 4,826,269 A | 5/1989 | Streifer et al. |
| 4,851,358 A | 7/1989 | Huber |
| 4,857,689 A | 8/1989 | Lee |
| 4,857,704 A | 8/1989 | Jannot et al. |
| 4,891,499 A | 1/1990 | Moslehi |
| 4,933,887 A | 6/1990 | Danko et al. |
| 4,937,490 A | 6/1990 | Camm et al. |
| 4,956,538 A | 9/1990 | Moslehi |
| 4,958,061 A | 9/1990 | Wakabayashi et al. |
| 4,959,244 A | 9/1990 | Penney et al. |
| 4,979,134 A | 12/1990 | Arima et al. |
| 4,981,815 A | 1/1991 | Kakoschke |
| 4,984,902 A | 1/1991 | Crowley et al. |
| 5,002,630 A | 3/1991 | Kermani et al. |
| 5,011,794 A | 4/1991 | Grim et al. |
| 5,041,714 A | 8/1991 | Funk |
| 5,073,698 A | 12/1991 | Stultz |
| 5,155,336 A | 10/1992 | Gronet et al. |
| 5,155,337 A | 10/1992 | Sorrell et al. |
| 5,188,458 A | 2/1993 | Thompson et al. |
| 5,196,353 A | 3/1993 | Sandhu et al. |
| 5,219,786 A | 6/1993 | Noguchi |
| 5,231,595 A | 7/1993 | Makino et al. |
| 5,255,286 A | 10/1993 | Moslehi et al. |
| 5,258,824 A | 11/1993 | Carlson et al. |
| 5,271,084 A | 12/1993 | Vandenabeele et al. |
| 5,275,629 A | 1/1994 | Ajika et al. |
| 5,279,973 A | 1/1994 | Suizu |
| 5,282,017 A | 1/1994 | Kasindorf et al. |
| 5,293,216 A | 3/1994 | Moslehi |
| 5,305,417 A | 4/1994 | Najm et al. |
| 5,308,161 A | 5/1994 | Stein |
| 5,310,260 A | 5/1994 | Schietinger et al. |
| 5,313,044 A | 5/1994 | Massoud et al. |
| 5,317,429 A | 5/1994 | Mochizuki et al. |
| 5,317,656 A | 5/1994 | Moskehi et al. |
| 5,325,180 A | 6/1994 | Chappelow et al. |
| 5,326,173 A | 7/1994 | Evans et al. |
| 5,336,641 A | 8/1994 | Fair et al. |
| 5,347,128 A | 9/1994 | Puram et al. |
| 5,350,899 A | 9/1994 | Ishikawa et al. |
| 5,359,693 A | 10/1994 | Nenyei et al. |
| 5,364,186 A | 11/1994 | Wang et al. |
| 5,373,135 A | 12/1994 | Beyer et al. |
| 5,387,557 A | 2/1995 | Takagi |
| 5,399,506 A | 3/1995 | Tsukamoto |
| 5,399,523 A | 3/1995 | Kakoschke |
| 5,407,485 A | 4/1995 | Takagi |
| 5,418,885 A | 5/1995 | Hauser et al. |
| 5,431,700 A | 7/1995 | Sloan |
| 5,436,172 A | 7/1995 | Moslehi |
| 5,436,443 A | 7/1995 | Abtahi |
| 5,442,727 A | 8/1995 | Fiory |
| 5,444,217 A | 8/1995 | Moore et al. |
| 5,445,676 A | 8/1995 | Takagi |
| 5,446,824 A | 8/1995 | Moslehi |
| 5,446,825 A | 8/1995 | Moslehi et al. |
| 5,460,451 A | 10/1995 | Wadman |
| 5,463,534 A | 10/1995 | Raven |
| 5,487,127 A | 1/1996 | Gronet et al. |
| 5,490,728 A | 2/1996 | Schietinger et al. |
| 5,501,637 A | 3/1996 | Duncan et al. |
| 5,508,934 A | 4/1996 | Moslehi et al. |
| 5,514,885 A | 5/1996 | Myrick |
| 5,517,359 A | 5/1996 | Gelbart |
| 5,530,221 A | 6/1996 | Benda et al. |
| 5,539,855 A | 7/1996 | Takahashi et al. |
| 5,561,612 A | 10/1996 | Thakur |
| 5,561,735 A | 10/1996 | Camm |
| 5,580,388 A | 12/1996 | Moore |
| 5,593,608 A | 1/1997 | Suzuki |
| 5,597,237 A | 1/1997 | Stein |
| 5,601,366 A | 2/1997 | Paranjpe |
| 5,603,772 A | 2/1997 | Ide |
| 5,604,592 A | 2/1997 | Kotidis et al. |
| 5,628,564 A | 5/1997 | Nenyei et al. |
| 5,635,093 A | 6/1997 | Arena et al. |
| 5,635,409 A | 6/1997 | Moslehi |
| 5,650,082 A | 7/1997 | Anderson |
| 5,654,904 A | 8/1997 | Thakur |
| 5,677,240 A | 10/1997 | Murakami et al. |
| 5,710,407 A | 1/1998 | Moore et al. |
| 5,715,361 A | 2/1998 | Moslehi |
| 5,727,017 A | 3/1998 | Maurer et al. |
| 5,738,165 A * | 4/1998 | Imai .................... 165/80.2 |
| 5,738,440 A | 4/1998 | O'Neill et al. |
| 5,790,750 A | 8/1998 | Anderson |
| 5,802,099 A | 9/1998 | Curran et al. |
| 5,809,211 A | 9/1998 | Anderson et al. |
| 5,814,365 A | 9/1998 | Mahawili |
| 5,822,172 A | 10/1998 | White |
| 5,830,277 A | 11/1998 | Johnsgard et al. |
| 5,841,110 A | 11/1998 | Nenyei et al. |
| RE36,050 E | 1/1999 | Thakur et al. |
| 5,858,819 A | 1/1999 | Miyasaka |
| 5,893,952 A | 4/1999 | Aronowitz et al. |
| 5,900,649 A | 5/1999 | Effelsberg |
| 5,908,307 A | 6/1999 | Talwar et al. |
| 5,937,142 A | 8/1999 | Moslehi et al. |
| 5,944,422 A | 8/1999 | Doitel et al. |
| 5,960,158 A | 9/1999 | Gat et al. |
| 5,971,565 A | 10/1999 | Zapata et al. |
| 5,993,059 A | 11/1999 | O'Neill et al. |

| | | | | | |
|---|---|---|---|---|---|
| 5,998,768 | A | 12/1999 | Hunter et al. | EP | 0 538 874 | 4/1993 |
| 6,016,383 | A | 1/2000 | Gronet et al. | EP | 0 576 791 | 1/1994 |
| 6,051,483 | A | 4/2000 | Lee et al. | EP | 0 598 409 | 5/1994 |
| 6,066,516 | A | 5/2000 | Miyasaka | EP | 0 840 360 | 5/1998 |
| 6,108,490 | A | 8/2000 | Lee et al. | EP | 0 942 268 | 9/1999 |
| 6,122,439 | A | 9/2000 | Gronet et al. | EP | 1 073 096 | 1/2001 |
| 6,146,504 | A | 11/2000 | Patadia et al. | EP | 1 557 868 | 7/2005 |
| 6,171,641 | B1 | 1/2001 | Okamoto et al. | GB | 938699 | 10/1963 |
| 6,187,616 | B1 | 2/2001 | Gyoda | GB | 2 065 973 | 7/1981 |
| 6,188,838 | B1 | 2/2001 | Mikata et al. ............... 392/418 | JP | 55-115327 | 9/1980 |
| 6,196,532 | B1 | 3/2001 | Otwell ............... 269/21 | JP | 56-048128 | 5/1981 |
| 6,283,630 | B1 | 9/2001 | Yazawa | JP | 57-080729 | 5/1982 |
| 6,293,696 | B1 | 9/2001 | Guardado | JP | 57-208146 | 12/1982 |
| 6,303,411 | B1 | 10/2001 | Camm et al. | JP | 58-070536 | 4/1983 |
| 6,303,917 | B1 | 10/2001 | Hawryluk | JP | 58-106836 | 6/1983 |
| 6,315,878 | B1 | 11/2001 | Patadia et al. | JP | 59-211221 | 11/1984 |
| 6,348,099 | B1 | 2/2002 | Xia et al. | JP | 01-246828 | 10/1989 |
| 6,349,270 | B1 | 2/2002 | Gurary et al. | JP | 01-268120 | 10/1989 |
| 6,375,348 | B1 | 4/2002 | Hebb et al. | JP | 02-294027 | 12/1990 |
| 6,376,806 | B2 | 4/2002 | Yoo | JP | 04-355911 | 12/1992 |
| 6,406,545 | B2 | 6/2002 | Shoda et al. | JP | 06-318558 | 11/1994 |
| 6,494,371 | B1 | 12/2002 | Rekow et al. | JP | 07-245274 | 9/1995 |
| 6,531,681 | B1 | 3/2003 | Markle et al. | JP | 08-107113 | 4/1996 |
| 6,534,752 | B2 | 3/2003 | Camm et al. | JP | 08-261967 | 10/1996 |
| 6,536,131 | B2 | 3/2003 | Davis | JP | 09-293684 | 11/1997 |
| 6,561,796 | B1 | 5/2003 | Barrera et al. | JP | 10-050629 | 2/1998 |
| 6,564,166 | B1 | 5/2003 | Ume et al. | JP | 10-110977 | 4/1998 |
| 6,594,446 | B2 | 7/2003 | Camm et al. | JP | 11-097371 | 4/1999 |
| 6,608,967 | B1 | 8/2003 | Arrison | JP | 2004-179510 | 6/2004 |
| 6,609,909 | B2 | 8/2003 | Aoki et al. | JP | 2004-186542 | 7/2004 |
| 6,610,968 | B1 | 8/2003 | Shajii et al. | JP | 2004-247339 | 9/2004 |
| 6,613,685 | B1 | 9/2003 | Granneman et al. | JP | 2005-116812 | 4/2005 |
| 6,621,199 | B1 | 9/2003 | Perfeniuk et al. | KR | 1999-0020323 | 6/1999 |
| 6,634,882 | B2 * | 10/2003 | Goodman ............... 432/253 | NO | 32864 | 8/1921 |
| 6,645,356 | B1 | 11/2003 | Woodruff et al. | TW | 465000 | 11/2001 |
| 6,669,783 | B2 | 12/2003 | Sexton et al. | TW | 526580 | 4/2003 |
| 6,702,302 | B2 | 3/2004 | Smedt et al. | TW | 556283 | 10/2003 |
| 6,752,625 | B1 | 6/2004 | Aschner et al. | WO | WO 87/05054 | 8/1987 |
| 6,849,831 | B2 | 2/2005 | Timans et al. | WO | WO 91/10873 | 7/1991 |
| 6,855,916 | B1 | 2/2005 | Matthews et al. | WO | WO 94/01982 | 1/1994 |
| 6,859,616 | B2 | 2/2005 | Kusuda et al. | WO | WO 99/41777 | 8/1999 |
| 6,885,815 | B2 | 4/2005 | Kusuda et al. | WO | WO 99/58733 | 11/1999 |
| 6,887,317 | B2 | 5/2005 | Or et al. | WO | WO 99/60184 | 11/1999 |
| 6,897,130 | B2 | 5/2005 | Miyauchi et al. | WO | WO 00/67298 | 11/2000 |
| 6,938,649 | B2 | 9/2005 | Nakazawa | WO | WO 01/56064 | 8/2001 |
| 6,941,063 | B2 | 9/2005 | Camm et al. | WO | WO 02/47123 | 6/2002 |
| 6,953,338 | B2 | 10/2005 | Kreiser et al. ............... 432/259 | WO | WO 02/47143 | 6/2002 |
| 6,963,692 | B2 | 11/2005 | Camm et al. | WO | WO 03/060447 | 7/2003 |
| 6,987,240 | B2 | 1/2006 | Jennings et al. | WO | WO 2004/057650 | 7/2004 |
| 6,998,580 | B2 | 2/2006 | Kusuda et al. | WO | WO 2005/029014 | 3/2005 |
| 7,002,363 | B2 | 2/2006 | Mathieu | WO | WO 2005/059991 | 6/2005 |
| 7,005,601 | B2 | 2/2006 | Jennings | WO | WO 2005/078762 | 8/2005 |
| 7,070,660 | B2 * | 7/2006 | Keeton et al. ............... 118/725 | WO | WO 2008/058397 | 5/2008 |
| 7,184,657 | B1 | 2/2007 | Camm et al. ............... 392/418 | | | |
| 2001/0013684 | A1 | 8/2001 | Smedt et al. | | | |
| 2001/0047990 | A1 | 12/2001 | Yoo | | | |
| 2002/0000547 | A1 | 1/2002 | Yamaguchi | | | |
| 2002/0096169 | A1 | 7/2002 | Gabelmann | | | |
| 2002/0102098 | A1 | 8/2002 | Camm et al. | | | |
| 2003/0022402 | A1 | 1/2003 | Takano | | | |
| 2003/0081945 | A1 | 5/2003 | Kusuda | | | |
| 2003/0196993 | A1 | 10/2003 | Jennings | | | |
| 2004/0105670 | A1 | 6/2004 | Kusuda et al. | | | |
| 2004/0178553 | A1 | 9/2004 | Camm et al. ............... 269/55 | | | |
| 2005/0018196 | A1 | 1/2005 | Kusuda | | | |
| 2005/0062388 | A1 | 3/2005 | Camm et al. | | | |
| 2005/0063448 | A1 | 3/2005 | Kusuda | | | |
| 2005/0063453 | A1 | 3/2005 | Camm et al. | | | |
| 2005/0133167 | A1 * | 6/2005 | Camm et al. ............... 156/345.51 | | | |
| 2005/0179354 | A1 | 8/2005 | Camm et al. | | | |
| 2005/0284371 | A1 * | 12/2005 | McFadden et al. ............... 118/715 | | | |
| 2006/0096677 | A1 | 5/2006 | Camm et al. | | | |
| 2006/0291835 | A1 | 12/2006 | Nozaki et al. ............... 392/416 | | | |
| 2007/0069161 | A1 | 3/2007 | Camm et al. ............... 250/504 | | | |
| 2008/0157452 | A1 | 7/2008 | Camm et al. | | | |

FOREIGN PATENT DOCUMENTS

| | | |
|---|---|---|
| EP | 0 399 662 | 11/1990 |
| EP | 0 446 425 | 9/1991 |

OTHER PUBLICATIONS

Office Action mailed Jun. 9, 2006 in connection with commonly owned U.S. Appl. No. 11/018,388.

Office Action mailed Oct. 25, 2006 in connection with commonly owned U.S. Appl. No. 11/018,388.

Office Action mailed Mar. 30, 2007 in connection with commonly owned U.S. Appl. No. 11/018,388.

Office Action mailed Oct. 16, 2007 in connection with commonly owned U.S. Appl. No. 11/018,388.

Office Action mailed Mar. 18, 2008 in connection with commonly owned U.S. Appl. No. 11/018,388.

Notice of Allowance mailed Sep. 29, 2008 in connection with commonly owned U.S. Appl. No. 11/018,388.

British Stainless Steel Association, "Maximum service temperatures in air for stainless steels," author unknown, published at http://www.bssa.org.uk/topics.php?article=42, as of Sep. 13, 2010, earliest publication date unknown.

British Stainless Steel Association, "Melting temperature ranges for stainless steels," author unknown, published at http://www.bssa.org.uk/topics.php?article=103, as of Sep. 13, 2010, earliest publication date unknown.

Blake, et al. "Slip Free Rapid Thermal Processing," Mat. Res. Soc. Symp. Proc., vol. 92, pp. 265-272, 1987.

Bomke, et al. "Annealing of Ion-Implanted Silicon by an Incoherent Light Pulse," Appl. Phys. Lett, vol. 33, No. 11, pp. 955-957, Dec. 1, 1978.

Burggraf, "Rapid Wafer Heating: Status 1983," Semiconductor International, pp. 69-74, Dec. 1983.

Camm, et al. "2D Real Time Temperature Measurements in a new Short Wavelength Arc Lamp RTP Chamber for Improved Uniformity," Proc. $3^{rd}$ Int. RTP Conf, RTP'95 p. 241 (Round Rock, Texas), 1995.

Camm, et al. "Engineering Ultra-Shallow Junctions using fRTP™," $10^{th}$ IEE International Conference on Advanced Thermal Processing of Semiconductors—RTP 2002, pp. 5-10, 2002.

Camm, et al. "High Power Arc Lamp RTP System for High Temperature Annealing Applications," Proc. $2^{nd}$ Int. RTP Conf, RTP'94, p. 259 (Round Rock, Texas) 1994.

Camm, et al. "Spike Thermal Processing Using Arc Lamps," Advances in Rapid Thermal Processing, 2000.

Celler, et al. "Drift of Arsenic in $SiO_2$ in a Lamp Furnace with a Built-in Temperature Gradient," Mat. Res. Soc. Symp. Proc., vol. 92, pp. 53-58, 1987.

Chen, et al. "The Use of a Kaleidoscope to Obtain Uniform Flux over a Large Area in a Solar or Arc Imaging Furnace," Applied Optics, vol. 2, No. 3, pp. 265-271, Mar. 1963.

Cibere, et al. "Flash Thermal Processing through the Melting Point of Silicon," $11^{th}$ IEEE International Conference on Advanced Thermal Processing of Semiconductors—RTP 2003.

Cohen, et al. "Thermally Assisted Flash Annealing of Silicon and Germanium," Appl. Phys. Lett., vol. 33, No. 8, pp. 751-753, Oct. 1978.

Current, et al. "Ion Implantation and Rapid Annealing of 125 mm Wafers," Solid State Technology, pp. 197-202, Oct. 1983.

Dilhac, et al. "Adaptive Process Control for a Rapid Thermal Processor," SPIE vol. 1393, Rapid Thermal and Related Processing Techniques, pp. 395-403, 1990.

Dihac, et al. "Thermal Model for Rapid Thermal Processors: Theory and Applications," RTP'93 Conference Proceedings, pp. 12-18, 1993.

Fair, "Rapid Thermal Processing—A Justification," in Fair, R.B. ed., *Rapid Thermal Processing: Science and Technology* (Boston: Academic Press, Inc.) pp. 1-11, 1993.

Fan, et al. "Transient Heating with Graphite Heaters for Semiconductor Processing," in Appleton B.R., et al., ed, *Laser and Electron-Beam Interactions with Solids: Proceedings of the Materials Research Society Annual Meeting*, Nov. 1981, Boston (New York: North Holland, Elsevier, 1982), pp. 751-758.

Fiory, et al. "Annealing Ultra-Low Energy Boron Implants with an Arc Lamp System," RTP 1999, pp. 273-280, 1999.

Fiory, et al. "Electrical Measurements of Annealed Boron Implants for Shallow Junctions," Advances in Rapid Thermal Processing, vol. 99-10, pp. 133-140, 1999.

Fiory, et al. "Spike Annealing of Implanted PMOS Gates," Proc. of RTP 2000 Conference, pp. 1-8, Sep. 20-22, 2000.

Gat, et al. "Introduction to Heatpulse™ Processing Technology," AG Associates, Mountain View, CA, pp. 1-29.

Gelpey, et al. "Advanced Annealing for Sub-133nm Junction Formation," $201^{st}$ Electrochemical Society Meeting, Symposium Q1, Rapid Thermal and Other Short-Time Processing Technologies III, May 12-17, 2002, paper 735 (May 2002).

Gelpey, et al. "Process Control for a Rapid Optical Annealing System" Mat. Res. Soc. Symp. Press, vol. 52, 1986.

Gelpey, et al. "Rapid Optical Annealing Using the Water-Wall DC Arc Lamp," Microelectronic Manufacturing and Testing, pp. 22-24, Aug. 1983.

Hill, et al. "Rapid Thermal Annealing—Theory and Practice," in Levy, R.A., ed., *Reduced Thermal Processing for ULSI* (New York: Plenum, 1989) pp. 143-180.

Hirscher, "Electrostatic Chuck to Boost Your Yield," Unaxis Wafer Processing, Chip Online, Issue No. 5, pp. 39-43, undated.

Kakoschke, "is There a Way to a Perfect Rapid Thermal Processing System?" Mat. Res. Soc. Symp. Proc., vol. 224, pp. 159-170 1991.

Kakoschke, et al. "Simulation of Temperature Effects During Rapid Thermal Processing," Mat. Res. Soc. Symp. Proc, vol. 146, pp. 473-482 1989.

Kapany, et al. "Fiber Optics. Part II. Image Transfer on Static and Dynamic Scanning with Fiber Bundles," Journal of the Optical Society of America, vol. 47, No. 5, pp. 423-427, May 1957.

Klabes, et al. "Pulsed Incoherent Light Annealing of Arsenic and Phosphorus Implanted Polycrystalline Silicon," Physica Status Solidi, pp. K5-7, K9-12, 1982.

Lefrancois, et al. "Emissivity Independent Process Control in a Short Wavelength Arc Lamp RTP Chamber," in *MRS Symposium Proceedings*, vol. 429, Rapid Thermal and Integrated Processing V, p. 321, Pittsburgh, 1996.

Lefrancois, et al. "Temperature Uniformity During Impulse™ Anneal," $8^{th}$ International Conference on Advanced Thermal Processing of Semiconductors, RTP 2000, pp. 1-6, Sep. 20-22, 2000.

Lietoila, et al. "Temperature Rise Induced in Si by Continuous Xenon Arc Lamp Radiation," American Institute of Physics, vol. 53, No. 2, pp. 1169-1172, Feb. 1982.

Lischner, et al. Rapid Large Area Annealing of Ion-implanted Si with Incoherent Light, in Appleton, B.R. et al., ed., *Laser and Electron-Beam Interactions with Solids: Proceedings of the Materials Research Society Annual Meeting*, Nov. 1981, Boston (New York: North Holland/Elsevier, 1982), pp. 759-764.

Lojek, "Issues in Manufacturing Unique Silicon Devices Using Rapid Thermal Annealing," in Fair, R.B., ed., *Rapid Thermal Processing: Science and Technology* (Boston: D61 Academic Press, Inc., 1993) pp. 311-347.

Lord, "Thermal and Stress Analysis of Semiconductor Wafers in a Rapid Thermal Processing Oven," IEEE Transactions on Semiconductor Manufacturing, vol. 1, No. 3, pp. 105-114, Aug. 1988.

Lue, "Arc Annealing of BF+2 Implanted Silicon by a Short Pulse Flash Lamp," Appl. Phys. Lett., vol. 36, No. 1, pp. 73-76, Jan. 1, 1980.

Myer, "Zoomable Kaleidoscopic Mirror Tunnel," Applied Optics, vol. 10, No. 9, pp. 2179-2182, Sep. 1971.

Nishiyama, et al. "Radiation Annealing of Boron-Implanted Silicon with a Halogen Lamp," Japanese Journal of Applied Physics, vol. 19, No. 10, pp. L563-L566, Oct. 1980.

Nulman, et al. Pyrometric Emissivity Measurements and Compensation in an RTP Chamber, Mat. Res. Soc. Symp. Proc., vol. 146, pp. 461-466, 1989.

Potter, "Transmission Properties of Optical Fibers," Journal of the Optical Society of America, vol. 41, No. 10, pp. 1079-1089, Oct. 1961.

Powell, et al. "Activation of Arsenic-Implanted Silicon Using an Incoherent Light Source," Appl. Phys. Lett., vol. 39, No. 2, pp. 150-152, Jul. 15, 1981.

Powell, et al. "Annealing of Implantation Damage in Integrated-Circuit Devices Using an Incoherent Light Source," J. Vac. Sci. Technol., vol. 20, No. 1, pp. 32-36, Jan. 1982.

Riccardi, et al. "The Adaptive Secondary Mirror for the 6.5m Conversion of the Multiple Mirror Telescope," Beyond Conventional Adaptive Optics, 10 pages, Venice, 2001.

Roozeboom, "Manufacturing Equipment Issues in Rapid Thermal Processing," in Fair, R.B., ed., *Rapid Thermal Processing: Science and Technology* (Boston: Academic Press, Inc., 1993), pp. 349-423.

Ross, et al. "Characterizing Implant Behavior During Flash RTP by Means of Backside Diagnostics," $10^{th}$ IEEE International Conference on Advanced Thermal Processing of Semicnductors—RTP 2002, pp. 99-105 (2002).

Sedgwick, "Short Time Annealing," J. Electrochem. Soc., vol. 130, No. 2, pp. 484-492, Feb. 1983.

Semco Engineering, "Smart Solutions for . . . Single Wafer Clamping," as available from http://www.semcoeng.com/Pilot01/Rubrique/Index.php3?IdTheme=6&IdPage=24 on Jul. 11, 2006 (undated).

Semiconductor Industry Association, "International Technology Roadmap for Semiconductors," International Sematech, Austin Texas, pp. 7, 14, 123-131 (1999).

Service Support Specialties, "Hot Plates," as available from http://www.s-cubed.com/pdf/StandAloneHP.pdf on Jul. 11, 2006.

Sheets, "Automatic Cassette to Cassette Radiant Impulse Processor," Nuclear Instruments and Methods in Physics Research, Amsterdam, North Holland / Elsevier Science Publishers B.V., pp. 219-223, 1985.

Stuart, et al. "Temperature Diagnostics for a Dual-Arc FRTP Tool," 10th IEEE International Conference on Advanced Thermal Processing of Semiconductors—RTP 2002—pp. 77-82, 2002.

Sumitomo Osaka Cement Co., Ltd., Advanced Materials Research Division, "Characteristics of fine $Al_2O_3$-SiC Composite ESC," Technical Report, 1999.

Tamarack Scientific Company, "Transient Calorimeter Calibration System" Technical Report AFFDL-TR-75-24, Orange, California, pp. 1-50, Mar. 1975.

Tichy, et al. "Annealing of Ultra-Shallow Implanted Junctions using Arc-Lamp Technology: Achieving the 90 nm Node," 9th IEEE International Conference on Advanced Thermal Processing of Semiconductors—RTP 2001, Sep. 2001.

Tillmann, et al. "Processing of 200 and 300 mm Wafers in an Advanced Rapid Thermal Processing System" Proc. RTP 1998, 6th International Conference on Advanced Thermal Processing of Semiconductors, Kyoto, Japan, 1998, pp. 62-63, 1998.

Vandenabeele, et al. "Impact of Patterned Layers on Temperature Non-Uniformity During Rapid Thermal Processing for VLSI-Applications," Mat. Res. Soc. Symp. Proc., vol. 146, pp. 149-160, 1989.

Varian, Extrion Division Semiconductor Equipment Group, "RTP-800 Rapid Thermal Processor," pp. 1-6, Dec. 1985.

von Gutfeld, "Crystallization of Silicon for Solar Cell Applications," IBM Technical Disclosure, vol. 19, IBM Corp., pp. 3955-3956, Mar. 1977.

Williamson, "Cone Channel Condenser Optics," Journal of the Optical Society of America, vol. 42, No. 10, pp. 712-715, Oct. 9152.

Wilson, et al. "An Overview and Comparison of Rapid Thermal Processing Equipment: A User's Viewpoint," Mat. res. Soc. Symp. Proc., vol. 52, pp. 181-190, 1986.

Search Report completed Nov. 15, 2011 and issued to Taiwanese patent application 093139109.

* cited by examiner

SYSTEMS AND METHODS FOR SUPPORTING A WORKPIECE DURING HEAT-TREATING

CROSS-REFERENCE TO RELATED APPLICATIONS

This application claims the benefit of U.S. provisional application No. 60/858,946, filed Nov. 15, 2006.

BACKGROUND OF THE INVENTION

1. Field of Invention

The present invention relates to heat-treating, and more particularly to systems and methods for supporting a workpiece during heat-treating thereof.

2. Description of Related Art

Numerous applications involve heat-treating a workpiece. For example, in the manufacture of semiconductor chips such as microprocessors, the workpiece typically includes a semiconductor wafer, supported in a thermal processing chamber for annealing or other heat-treating purposes. Commonly owned U.S. patent application Ser. No. 11/018,388 (publication no. US 2005/0133167, hereby incorporated herein by reference) discusses examples of heat-treating techniques for annealing such semiconductor wafers, in which the wafer is first pre-heated to an intermediate temperature, following which the top or device side surface is rapidly heated to an annealing temperature. The initial pre-heating stage occurs at a rate significantly slower than a thermal conduction time through the wafer, and may be achieved by irradiating the back-side or substrate side of the wafer with an arc lamp or other irradiance device, to heat the wafer at a ramp rate less than 400° C. per second, for example. The subsequent surface heating stage occurs much more rapidly than the thermal conduction time through the wafer, so that only the device side surface is heated to the final annealing temperature, while the bulk of the wafer remains close to the cooler intermediate temperature. Such surface heating may be achieved by exposing the device-side surface to a high-power irradiance flash from a flash-lamp or bank of flash lamps, the flash having a relatively short duration, such as one millisecond, for example. The cooler bulk of the wafer then acts as a heat sink to facilitate rapid cooling of the device side surface.

Such annealing methods, which involve rapidly heating the device side of the wafer to a substantially higher temperature than the bulk of the wafer, tend to cause the device side to thermally expand at a greater rate than the rest of the wafer. Depending on the magnitude of the temperature difference between the device side temperature and the temperature of the bulk of the wafer, this may tend to cause "thermal bowing", whereby the normally planar wafer deforms itself into a thermally deformed shape. Depending on the magnitude and rapidity of the device side heating stage, the thermally deformed shape may have attributes of a dome shape, with the center of the wafer tending to rapidly rise relative to its edge regions. The thermal bowing may also cause the outer perimeter or edge of the workpiece (such as the outer two or four centimeters of a 30-cm diameter wafer, for example) to curl downward steeply, and thus, the thermally deformed shape may also have attributes of a saucer shape similar to a FRISBEE™ flying disc. In practice, for some applications it has been found that the latter curling effect at the outer perimeter of the workpiece tends to be more pronounced than the former dome-shaped curvature of the workpiece as a whole, although this may depend on the physical parameters of the thermal cycle in question. The thermally deformed shape represents a reduced stress configuration of the wafer, lowering the thermal stress resulting from the temperature gradient between the device side and the bulk of the wafer, and it is therefore undesirable to rigidly prevent this thermally induced motion.

Due to the extreme rapidity at which the device side of the wafer is heated (in the course of a 1-millisecond flash, for example, much faster than a typical thermal conduction time in the wafer), the deformation of the wafer may occur sufficiently rapidly that the edges of the wafer tend to move rapidly downward. If the wafer is supported by conventional support pins near its edges, the thermal bowing of the wafer may apply large downward forces to the support pins, potentially damaging or destroying both the pins and the wafer. Such forces may also cause the wafer to launch itself vertically upward from the support pins, which may result in further damage to the wafer as the wafer falls back down and strikes the pins. If the wafer is supported by support pins located further radially inward, the edges of the wafer may rapidly bow downward and strike a support plate above which the wafer is supported, potentially damaging or destroying the wafer. In addition, due to the rapidity at which such thermal bowing occurs, the initial velocities imparted to the various regions of the wafer tend to cause the wafer to overshoot the equilibrium minimum stress shape and rapidly oscillate or vibrate, resulting in additional stress and potentially damaging or destroying the wafer.

The above-noted US patent application publication no. US 2005/0133167 discloses, among other things, methods and apparatuses for suppressing thermally induced motion of a workpiece. In one such method, a damping member is spaced apart from the workpiece and is configured to apply a damping force to dampen the motion of the workpiece. In a particular illustrative embodiment, the damping member includes a quartz plate, the workpiece includes a semiconductor wafer, and the quartz plate is spaced apart from an initial position or rest position of the wafer by a distance sufficiently small that gas pressure between the quartz plate and the wafer opposes the thermally induced motion of the workpiece. For example, the quartz plate and the wafer may be spaced apart by only a distance of about one millimeter. In such a case, the irradiance flash may cause the central region of the wafer to rapidly rise upward away from the quartz plate, thereby creating a low gas pressure zone in the gap between the wafer and the plate. Thus, a pressure differential is created, between the higher ambient pressure above the wafer, and the lowered pressure in the gap beneath the wafer, which tends to oppose the upward motion of the wafer. Conversely, if the central region of the wafer comes back downward and overshoots its equilibrium position, this creates a higher pressure in the gap between the wafer and the plate than the ambient pressure above the wafer, so that the pressure differential continuously opposes the motion of the wafer as it oscillates or vibrates. Thus, motion and vibration of the wafer are dampened, without the necessity of potentially damaging physical contact between the wafer and the damping member.

SUMMARY OF THE INVENTION

The present inventors have appreciated that further improvements in damping such thermally induced motion and vibration while still permitting the wafer to thermally deform to reduce its internal thermal stress are desirable, to further reduce the likelihood of wafer damage or breakage.

In addition, the present inventors have also appreciated the significance of a "first wafer" effect and its impact on repeatability or consistency of successive thermal cycles performed with a particular heat-treating apparatus. In this regard, in heat-treating systems similar to those disclosed in US 2005/0133167 that rely on gas pressure between the damping plate and the wafer to suppress thermally induced wafer motion and vibration, due to the close spacing (e.g. 1 mm) between the damping plate and the wafer, thermal conduction between the plate and the wafer is considerably more significant than in systems employing larger spacing. Prior to commencement of heat-treating of the first wafer in such an apparatus, the quartz plate is initially cold, in thermal equilibrium with its surroundings. As heat-treating commences, the quartz plate begins to heat up, but typically does not heat up uniformly. Rather, partly due to edge effects of both the plate and the wafer, a thermal gradient develops in the plate, with the plate's central region being hottest, and progressively cooler temperatures being encountered moving radially outward toward its outer edge. The plate will be cooler than the wafer throughout the entire first cycle, and even as the plate heats up over repeated cycles, it will be cooler than the wafer throughout all except the commencement of the wafer's thermal cycle. Thermal conduction between the wafer and the plate is proportional to the temperature difference between them, and is inversely proportional the distance or separation between the two. Thus, if the spacing between the plate and the wafer is uniform, but the temperature difference between the hotter wafer and the cooler plate is greater at the outer regions than at the center, then the plate will conductively remove more heat energy from the outer regions of the wafer than from the center of the wafer. This may contribute to an undesirable thermal gradient in the wafer itself, causing thermal stress and potential stress damage in the wafer. Although this effect may be less significant in conventional systems in which the wafer is spaced far apart from the support plate (in which case conduction may be less significant than radiative transfer between the plate and wafer), this effect may become quite significant in systems in which the plate is closely spaced from the wafer (e.g. 1 mm) in order to rely on gas pressure therebetween to dampen thermally induced wafer motion and vibration. In the latter types of systems, due to the close spacing between the wafer and the plate, thermal conduction may account for a comparable or even a greater amount of the total heat transfer between the wafer and plate than radiative transfer. Thus, in such close-spaced systems, the non-uniform conductive heat loss from the wafer resulting from the non-uniform temperature distribution in the plate tends to produce significantly greater thermal gradients, with correspondingly greater thermal stress. These undesirable effects typically tend to persist over a number of thermal cycles, thereby subjecting a number of successive wafers to such thermal stress and potential damage, until the plate eventually approaches thermal equilibrium.

In accordance with an illustrative embodiment of the invention, there is provided an apparatus for supporting a workpiece during heat-treating thereof. The apparatus includes a support plate having a non-planar upper surface, and a support system. The support system is configured to support the workpiece above the support plate during heat-treating of the workpiece, such that a lower surface of an initial shape of the workpiece is supported at a non-uniform spacing above the non-planar upper surface of the support plate, said non-uniform spacing including an edge gap beneath an outer perimeter of the workpiece, and a central gap at a central axis of the workpiece.

Advantageously, providing such non-uniform spacing between a non-planar upper surface of the support plate and the workpiece allows numerous advantages to be achieved, in comparison with prior systems employing planar support plates uniformly spaced from the initial shape of the workpiece. For example, in embodiments in which the workpiece is a semiconductor wafer, the non-planar shape and corresponding non-uniform spacing from the initial shape of the workpiece may be configured to minimize spatial variations in heat loss rates across the workpiece when an expected non-uniform temperature distribution exists in the support plate, thereby addressing the "first wafer" effect. Alternatively, or in addition, the non-planar shape may be configured to control contact between the workpiece and the support plate when the workpiece thermally deforms to an expected thermally deformed shape, thereby preventing physical damage to or breakage of the workpiece. Alternatively, or in addition, the upper surface may be configured to be spaced from the expected thermally deformed shape of the workpiece by a distance sufficiently small that gas pressure between the workpiece and the plate opposes thermally induced motion of the workpiece, thereby damping thermally induced vibration of the workpiece while still allowing the workpiece to thermally deform to reduce its internal stress, thus further reducing the likelihood of damage to the workpiece.

Similarly, such embodiments may also provide significant advantages over prior systems employing non-planar supports. For example, a recently published approach purports to support a semiconductor wafer by resting the outer circumferential edge of the wafer upon an annular step, with the central region of the wafer being supported above a concave recess circumscribed by the annular step. However, supporting the wafer directly upon a rigid annular step during flash heating may cause breakage or damage, as the initial thermal bowing causes the wafer to apply a very large downforce at its outer perimeter where it is supported by the rigid annular step. As a result, the wafer may be subjected to excessive thermal stress, particularly during the first few hundred microseconds after commencement of the flash. The wafer may even launch itself vertically upward in order to be able to thermally deform itself to reduce its internal stress, causing elevated risks of breakage or damage at the times that the wafer self-launches and lands again. Advantageously, the existence of an edge gap allows any contact between the outer perimeter of the workpiece and the support plate to be controlled, so that the wafer is permitted to initially reduce its stress by thermally bowing but without launching itself up in the air. The existence of such an edge gap also allows the magnitude and timing of shock waves resulting from the impact to be controlled in order to further reduce the likelihood of breakage or damage, as discussed in greater detail herein.

The edge gap may be in the range of about $3 \times 10^{-4}$ m to about $1.2 \times 10^{-3}$ m. For example, the edge gap may be about one-half millimeter.

The central gap may be in the range of about $1.2 \times 10^{-3}$ m to about $2.5 \times 10^{-3}$ m.

The support system may include a plurality of flexible support members. For example, the plurality of flexible support members may include a plurality of quartz fibers.

Alternatively, the support system may include a plurality of support pins.

The edge gap and the central gap may be unequal. For example, the edge gap may be larger than the central gap. As a more particular example, the edge gap may be at least twice as large as the central gap, or at least three times as large as the central gap. Alternatively, the central gap may be larger than the edge gap.

The non-uniform spacing may minimize spatial variations in heat loss rates across the workpiece when an expected non-uniform temperature distribution exists in the support plate.

The non-uniform spacing may generally vary as a non-decreasing function of the radial distance. For example, the non-uniform spacing may be substantially constant at less than a threshold radial distance from the central axis of the workpiece and may generally increase as a function of radial distance from the threshold radial distance to a radius of the workpiece.

The central gap may be less than or equal to about one millimeter and the edge gap may be more than about two millimeters, for example.

The non-planar upper surface of the support plate may have a shape complementary to an expected thermally deformed shape of the workpiece.

For example, at least some of the upper surface of the support plate may be generally dome-shaped. As a further example, at least some of the upper surface of the support plate may be generally saucer-shaped. As a further example, at least some of the upper surface of the support plate may be generally frustoconical-shaped.

An inner region of the upper surface of the support plate may be generally concave, and an outer region of the upper surface of the support plate may be generally convex.

The upper surface of the support plate may extend outwardly and downwardly, from the central axis to the outer perimeter of the workpiece.

The upper surface of the support plate may include a contact portion configured to be struck by an outer perimeter of the workpiece during heat-treating thereof. The contact portion may be configured to apply a reaction force having a radially inward component to the outer perimeter of the workpiece in reaction to the outer perimeter of the workpiece striking the contact portion. The contact portion may be angled relative to an adjacent inward portion of the upper surface.

The upper surface of the support plate may be configured to be spaced from an expected thermally deformed shape of the workpiece by a distance sufficiently small that gas pressure between the upper surface and the expected thermally deformed shape of the workpiece opposes thermally induced motion of the workpiece. For example, the upper surface of the support plate may be configured to be spaced from the expected thermally deformed shape of the workpiece by a distance on the order of one millimeter.

The support plate may include a gas flow barrier configured to resist gas flow through a gap between the upper surface and the workpiece when the workpiece is supported above the support plate.

The gas flow barrier may include a turbulence generator. For example, the turbulence generator may include an annular channel defined in the upper surface of the support plate.

The support plate may include a removable portion including at least some of the upper surface of the support plate. For example, the support plate may include a lower portion and an upper portion, and the removable portion may include the upper portion.

The apparatus may further include a second upper portion having a differently shaped upper surface, and the second upper portion may be interchangeable with the upper portion to change a shape of the upper surface of the support plate.

The apparatus may further include a plurality of upper portions each having a uniquely shaped upper surface, and each of the plurality of upper portions may be interchangeable with the upper portion to change a shape of the upper surface of the support plate.

The removable portion may include a removable edge portion and a removable central portion.

The edge gap and the central gap may be adjustable.

The support plate may include a lensing portion configured to provide a desired lensing effect to electromagnetic radiation being transmitted through the support plate to the workpiece.

The apparatus may further include a second plate disposed above a plane at which the apparatus is configured to support the initial shape of the workpiece.

The apparatus may further include a heat-treating system configured to thermally induce motion of the workpiece. For example, the heat-treating system may be configured to preheat the workpiece to an intermediate temperature, and may be configured to heat only a surface region of the workpiece to a desired temperature greater than the intermediate temperature in less than a thermal conduction time of the workpiece.

In accordance with another illustrative embodiment of the invention, there is provided an apparatus for supporting a workpiece during heat-treating thereof. The apparatus includes a support plate having a non-planar upper surface. The apparatus further includes means for supporting the workpiece above the support plate during heat-treating of the workpiece, such that a lower surface of an initial shape of the workpiece is supported at a non-uniform spacing above the non-planar upper surface of the support plate, the non-uniform spacing including an edge gap beneath an outer perimeter of the workpiece, and a central gap at a central axis of the workpiece.

In accordance with another illustrative embodiment of the invention, there is provided a method including supporting a workpiece above a non-planar upper surface of a support plate during heat-treating of the workpiece, such that a lower surface of an initial shape of the workpiece is supported at a non-uniform spacing above the non-planar upper surface of the support plate, the non-uniform spacing including an edge gap beneath an outer perimeter of the workpiece, and a central gap at a central axis of the workpiece.

The edge gap may be in the range of about $3 \times 10^{-4}$ m to about $1.2 \times 10^{-3}$ mm and the central gap may be in the range of about $1.2 \times 10^{-3}$ m to about $2.5 \times 10^{-3}$ m, for example.

Supporting may include supporting the workpiece with a plurality of quartz fibers.

Supporting may include supporting the workpiece while heat-treating the workpiece, which may include thermally inducing motion of the workpiece. For example, thermally inducing motion of the workpiece may include heating only a surface region of the workpiece to a desired temperature in less than a thermal conduction time of the workpiece, thereby deforming the workpiece from the initial shape to a thermally deformed shape.

The non-uniform spacing may minimize spatial variations in heat loss rates across the workpiece when an expected non-uniform temperature distribution exists in the support plate.

Supporting may include supporting the thermally deformed shape of the workpiece above the upper surface of the support plate by a distance sufficiently small that gas pressure between the upper surface and the thermally deformed shape of the workpiece opposes thermally induced motion of the workpiece.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
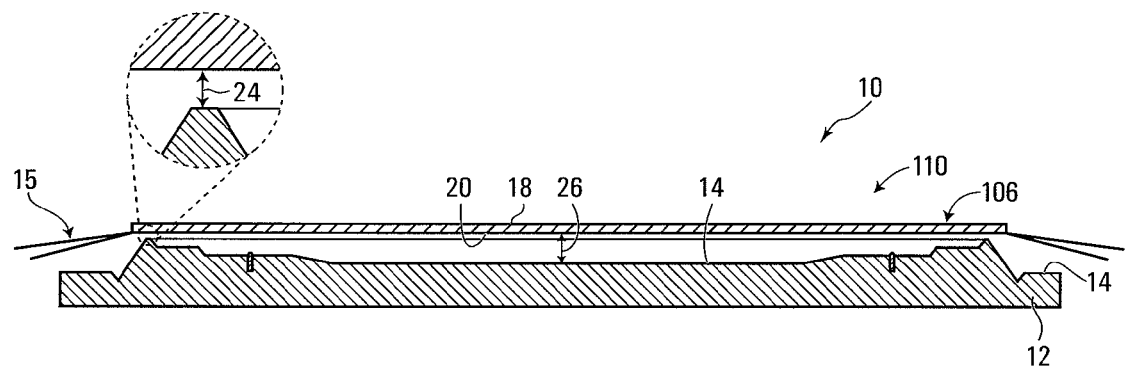
FIG. 1 is a central cross-section of an apparatus for supporting a workpiece according to a first embodiment of the invention.

Referring to FIG. 1, an apparatus for supporting a workpiece during heat-treating according to a first embodiment of the invention is shown generally at 10. The apparatus 10 includes a support plate 12 having a non-planar upper surface shown generally at 14, and a support system shown generally at 15. In this embodiment, the support system 15 is configured to support a workpiece 106 above the support plate 12 during heat-treatment of the workpiece, such that a lower surface 20 of an initial shape 110 of the workpiece 106 is supported at a non-uniform spacing above the non-planar upper surface 14 of the support plate 12. More particularly, in this embodiment the non-uniform spacing includes an edge gap 24 beneath an outer perimeter of the workpiece, and a central gap 26 at a central axis of the workpiece.

In this embodiment, the workpiece 106 includes a semiconductor wafer, and the support plate 12 includes a quartz plate. More particularly, in this embodiment the semiconductor wafer is intended to be supported above the support plate while being heat-treated in a manner that thermally induces motion of the workpiece. More particularly still, as discussed earlier herein, while supported above the support plate 12, the workpiece 106 is first pre-heated to an intermediate temperature, following which only an upper surface 18 of the workpiece is heated to a desired temperature greater than the intermediate temperature, in less than a thermal conduction time of the workpiece. As discussed earlier herein, such heat-treatment causes the workpiece 106 to thermally deform from its initial shape 110 to an expected thermally deformed shape.

Figure 2A:
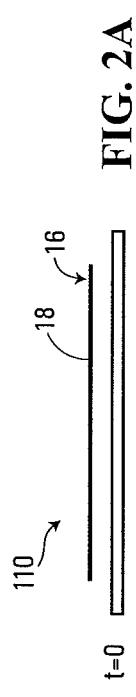
FIGS. 2A-2E are schematic cross-sections of an initial shape and four thermally deformed shapes of a workpiece.

More particularly, referring to FIGS. 1 and 2A-2E, in this embodiment the initial shape of the workpiece 106 is shown generally at 110 in FIG. 2A. In the present embodiment, the initial shape of the workpiece is disc-shaped. More particularly still, in this embodiment the workpiece 106 is a 300 mm diameter semiconductor wafer whose initial shape 110 is a planar disc, and four examples of expected thermally deformed shapes of the wafer are shown in FIGS. 2B-2E, respectively.

In this embodiment, the four expected thermally deformed shapes shown in FIGS. 2B-2E have been predicted by the present inventors. More particularly, such prediction has been achieved by using a high-speed camera and a calibrated imaging system to measure deformation characteristics of a 300 mm diameter semiconductor wafer similar to the workpiece 106, being subjected to the same thermal cycle as that to which the workpiece 106 will be subjected. Alternatively, or in addition, the various expected thermally deformed shapes shown in FIGS. 2B-2E may be generated using a thermal simulation, employing a developed finite element model. It is believed that detailed knowledge of the thermally deformed shapes shown in FIGS. 2B-2E was not known in the art prior to the publication of the present patent specification.

Referring to FIGS. 2A-2E, an illustrative thermal cycle involves pre-heating the workpiece 106 to an intermediate temperature, then heating only the upper surface 18 of the workpiece 106 to a desired temperature greater than the intermediate temperature. The latter surface heating step occurs within less than a thermal conduction time through the workpiece, and may be achieved, for example, by activating a flash lamp or bank of flash lamps. Initially, the workpiece 106 is in its planar initial shape 110 when it is subjected to the irradiance flash from the flash lamp(s), as shown in FIG. 2A. The irradiance flash commences at time t=0, and has a duration on the order of one millisecond.

Figure 2B:
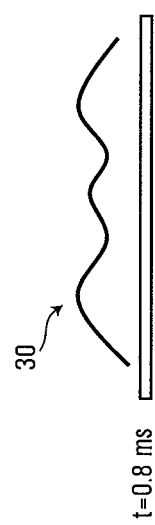

In the illustrative thermal cycle shown in FIGS. 2A-2E:

By time t=0.8 ms after the commencement of the irradiance flash, the workpiece 106 thermally "bows" or deforms into a first thermally deformed shape 30 shown in FIG. 2B.

Figure 2C:
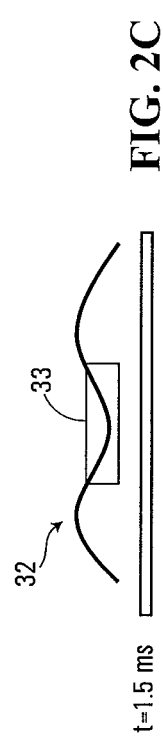

By time t=1.5 ms after the commencement of the irradiance flash, the workpiece thermally deforms into a second thermally deformed shape 32 shown in FIG. 2C.

Figure 2D:
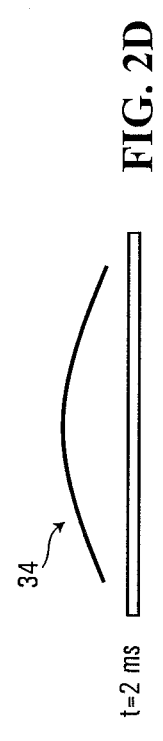

By time t=2.0 ms after the commencement of the irradiance flash, the workpiece thermally deforms into a third thermally deformed shape 34 shown in FIG. 2D.

Figure 2E:
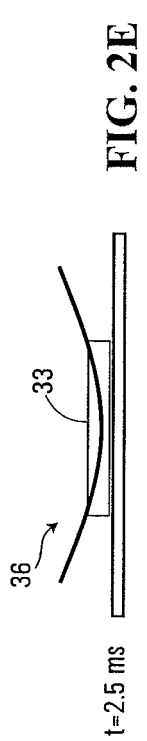

By time t=2.5 ms after the commencement of the irradiance flash, the workpiece thermally deforms into a fourth thermally deformed shape 36 shown in FIG. 2E (which shape it will roughly assume again at t=4.5 ms).

Alternatively, different thermally deformed shapes may be expected for different thermal cycles. Thus, variations in parameters of the thermal cycle (including, for example, the pulse duration and intensity of the irradiance flash) may cause variations in the thermally deformed shapes that are measured, simulated or expected.

Figure 3:
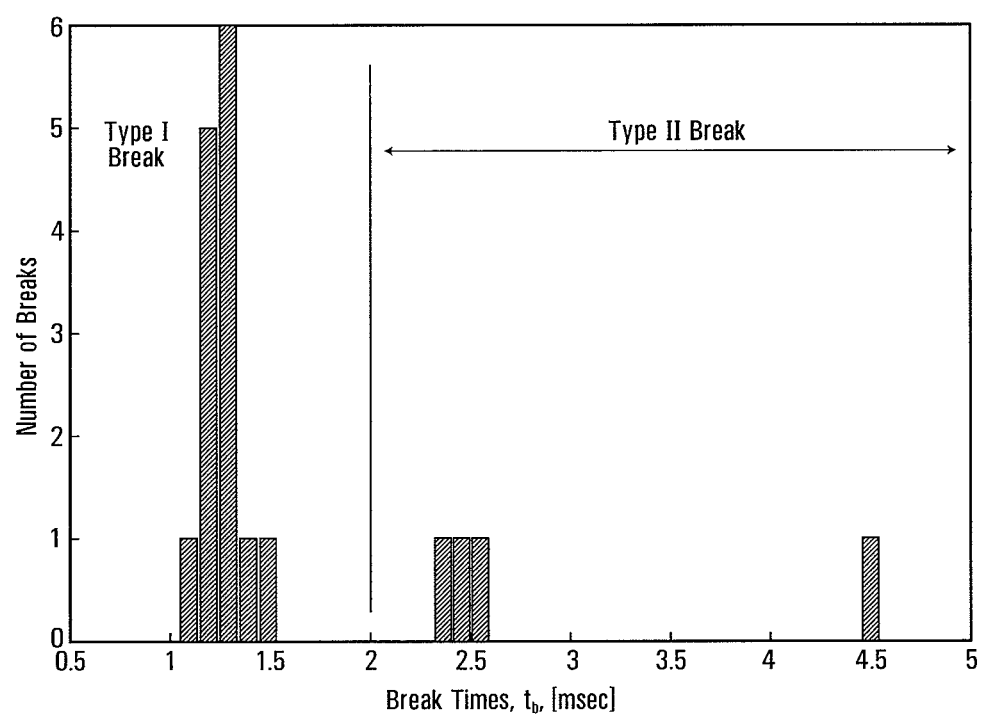
FIG. 3 is a graph of number of workpiece breakages versus time of a thermal cycle.

FIG. 3 illustrates workpiece breakages as a function of time, for an illustrative thermal cycle that does not employ an embodiment of the present invention to reduce such breakages.

Referring to FIGS. 2 and 3, the present inventors have found that workpiece breakages tend to fall within two broad categories, which the present inventors have categorized as "Type I" and "Type II" breaks.

In the illustrative thermal cycle, "Type I" breaks accounted for a large majority of breakages, and tended to occur between t=1 and t=1.5 milliseconds after commencement of the flash, while the workpiece 106 was transitioning between the first thermally deformed shape 30 shown in FIG. 2B and its second thermally deformed shape 32 shown in FIG. 2C. In this regard, in the second thermally deformed shape 32, a central region 33 of the workpiece is curved concavely so as to compress the upper surface 18 at the central region 33, rather than convexly to relieve stress from the thermal expansion of the upper surface 18. Thus, the central region 33 of the workpiece is under considerable stress, both from the rapid thermal expansion of the upper surface 18 and from the compression resulting from the curvature of the second thermally deformed shape 32 at the central region 33. If strong shock waves from an earlier initial impact of the outer edge of the workpiece 106 against the upper surface 18 are propagating through the central region 33 at the time that it is in the second thermally deformed shape 32, an increased likelihood of "Type I" breakage arises. The present inventors have also found that wafer damage, such as scratches, for example, significantly increases the likelihood of Type I breaks. As particular examples, wafer damage in regions on the bottom of the wafer that undergo concave curvature that aggravates the stress of thermal expansion, or damage in regions on the bottom the wafer that impact the quartz plate, increase the likelihood of breakage.

"Type II" breaks tended to occur while the workpiece 106 was in its fourth thermally deformed shape 36 shown in FIG. 2E. In this shape, the workpiece 106 has transitioned from the third thermally deformed shape 34 shown in FIG. 2D, whose convex curvature alleviates the stress on the central region 33 resulting from the thermal expansion of the upper surface 18, to the fourth thermally deformed shape 36, whose concave curvature aggravates the stress of thermal expansion by placing the upper surface 18 under compression. If the central region 33 of the workpiece strikes the support plate 12 with sufficient force while in this fourth thermally deformed shape 36, an increased likelihood of a "Type II" break may arise.

Referring back to FIG. 1, advantageously, the present embodiment reduces the likelihood of both "Type I" and "Type II" breaks, by virtue of the selected edge gap 24 and central gap 26, which in this embodiment are unequal.

More particularly, to reduce "Type I" breaks in the present embodiment, the edge gap 24 is in the range of about $3 \times 10^{-4}$ m to about $1.2 \times 10^{-3}$ m. More particularly still, in this embodiment the edge gap 24 is about one-half millimeter. In this regard, the present inventors have found that such an edge gap assists in controlling the magnitude and timing of shock waves resulting from the initial impact of the outer perimeter of the workpiece 106 against the support plate 12 when the wafer initially thermally "bows" in response to the irradiance flash. If the edge gap 24 is too large, then the outer perimeter of the workpiece 106 might not strike the support plate 12 at all. Although conventional wisdom suggests that physical contact between a silicon wafer and other objects during heat-treating is undesirable, the present inventors have found that for some thermal cycles, preventing this initial impact of the outer perimeter of the workpiece onto the support plate disadvantageously results in increased overall wafer deformation, with increased likelihood of both Type I and Type II breaks. Conversely, if the edge gap is too small or no edge gap was provided at all, the workpiece may suffer very significant mechanical stress in the first few hundred microseconds, and if the workpiece is supported on a rigid surface or on rigid supports, the initial thermal bowing of the workpiece may be sufficiently violent to launch the workpiece vertically upward, with a significant likelihood of damage at the time the workpiece launches itself and again when it falls back down.

Advantageously, therefore, in the present embodiment, the selection of an edge gap 24 in the range of about $3 \times 10^{-4}$ m to about $1.2 \times 10^{-3}$ m, or more particularly, an edge gap 24 of about one-half millimeter, reduces the likelihood of Type I breaks. For the illustrative thermal cycle, the present inventors have found that such an edge gap 24 tends to result in the outer perimeter of the workpiece 106 striking the upper surface 14 of the support plate somewhat before the outer perimeter of the workpiece reaches what otherwise would have been its maximum thermal bowing velocity induced by the irradiance flash. Thus, the initial impact of the outer perimeter of the workpiece onto the upper surface of the support plate advantageously dampens overall workpiece motion, thereby reducing the likelihood of Type I and Type II breaks in comparison with the absence of such an impact. This initial impact produces shock waves in the workpiece, but the shockwaves are not as intense as they would have been if the outer perimeter had reached its maximum possible velocity by the time of the impact. Also, the edge gap 24 is selected such that the timing of the impact ensures that the resulting shock waves travel through the central region 33 of the workpiece at a time when the workpiece is not in the second thermally deformed shape 32 shown in FIG. 2C. Thus, the likelihood of Type I breaks is significantly reduced. Alternatively, it will be appreciated that the optimum edge gap will depend upon the particular thermal cycle, workpiece and apparatus in question. Thus, for other examples or embodiments, other optimal values may be selected according to the teachings of the present specification, to achieve a desired balance between dampening overall workpiece motion, reducing the severity of and controlling the timing of shock waves.

To reduce the likelihood of "Type II" breaks, in the present embodiment the central gap 26 is in the range of about $1.2 \times 10^{-3}$ m to about $2.5 \times 10^{-3}$ m. More particularly, in this embodiment the central gap 26 is about one and one-half millimeters. In this regard, the present inventors have found that such a central gap 26 is advantageous for an illustrative thermal cycle, as it may achieve a desired balance between gas pressure damping and reducing the severity of contact between the central region 33 of the workpiece 106 and the support plate 12. Gas pressure damping, as discussed in greater detail in the above-mentioned commonly owned U.S. patent application publication no. 2005/0133167, involves spacing the workpiece apart from the support plate by a distance sufficiently small that gas pressure between the upper surface of the support plate 12 and the lower surface 20 of the workpiece 106 opposes thermally induced motion of the workpiece. Thus, as the central gap 26 increases, its associated gas pressure damping effect diminishes, thereby increasing overall workpiece motion, with a greater resulting likelihood of breakage (Type I or II). Conversely, however, increasing the central gap 26 may reduce the severity or frequency of impacts of the central region, thereby preventing at least some Type II breaks that would have otherwise resulted from such impacts. Accordingly, for the illustrative thermal cycle of the present embodiment, the present inventors have found that a central gap 26 in the range of about $1.2 \times 10^{-3}$ m to about $2.5 \times 10^{-3}$ m tends to balance these considerations, resulting in an overall reduction in breakage likelihood. Alternatively, it will be appreciated that the optimum central gap will depend upon the particular thermal cycle, workpiece and apparatus in question. Thus, for other examples or embodiments, other optimal values may be selected according to the teachings of the present specification, to achieve a desired balance between gas-pressure damping of overall workpiece motion, and reducing the severity and frequency of impacts of the central region 33 onto the support plate 12.

Referring back to FIG. 1, in this embodiment the support system 15 includes a plurality of flexible support members. More particularly, in this embodiment the plurality of flexible support members includes a plurality of quartz fibers. More particularly still, in this embodiment the plurality of quartz fibers includes a plurality of quartz fiber loops, similar to those described in commonly owned copending U.S. patent application Ser. No. 10/742,575 (publication no. US 2004/0178553, hereby incorporated herein by reference), in connection with FIGS. 23 and 24 thereof. Alternatively, the support system may include a plurality of support pins, as discussed in connection with other embodiments below.

Figure 4:
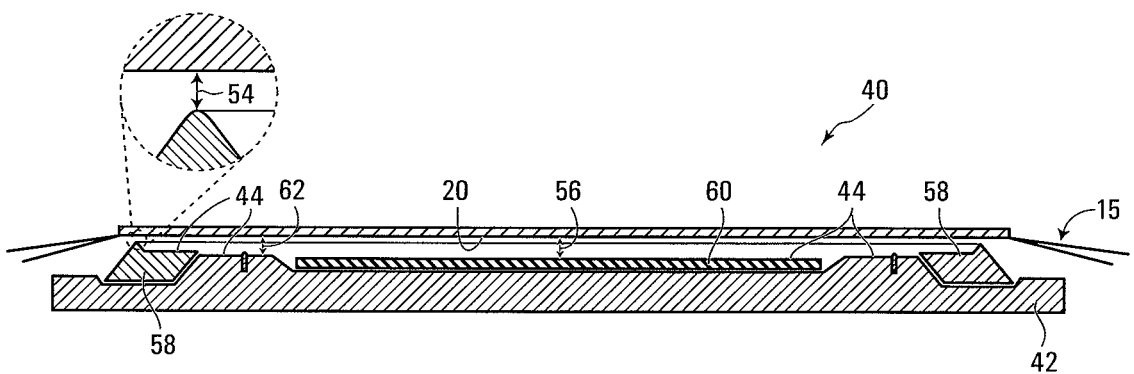
FIG. 4 is a central cross-section of an apparatus for supporting a workpiece according to a first embodiment of the invention.

Referring to FIGS. 1 and 4, an apparatus for supporting a workpiece during heat-treating according to a second embodiment of the invention is shown generally at 40 in FIG. 4 The apparatus 40 is similar to the apparatus 10 shown in FIG. 1, and includes a support plate 42 having a non-planar upper surface shown generally at 44. The apparatus 40 further includes the support system 15, which in this embodiment is configured to support the workpiece 106 above the support plate 42 during heat-treatment of the workpiece, such that the lower surface 20 of the initial shape of the workpiece is supported at a non-uniform spacing above the non-planar upper surface 44 of the support plate 42. More particularly, in this embodiment the non-uniform spacing includes an edge gap 54 beneath an outer perimeter of the workpiece, and a central gap 56 at a central axis of the workpiece.

In the present embodiment, the edge gap 54 and the central gap 56 are adjustable. More particularly, in this embodiment the support plate 42 includes a removable portion comprising at least some of the upper surface 44 of the support plate. More particularly still, in this embodiment the removable portion includes a removable edge portion 58 and a removable central portion 60.

In this embodiment, the removable edge portion 58 includes an annular quartz ring mounted on top of the support plate 42 by gravity or any other means suitable for heat-treatment and removability. The removable edge portion 58 can be replaced with other similar annular quartz rings (not shown) having different heights than the removable edge portion 58 shown in FIG. 4, thereby adjusting the edge gap 54. In this embodiment, the edge gap 54 is measured as the local minimum of the non-uniform spacing between the upper surface 44 of the support plate 42 and the lower surface 20 of the workpiece 106, beneath the outer perimeter of the workpiece. More particularly, in this embodiment, in which the workpiece is a semiconductor wafer, the outer perimeter of the workpiece includes an outer exclusion zone of the wafer, in which no devices are formed. In the present embodiment, the edge gap 54, or more particularly the local minimum in the non-uniform spacing beneath the outer perimeter of the workpiece, occurs at r=148 mm from the central axis of the workpiece (i.e., 2 mm radially inward from the outermost circumference of the workpiece, at r=150 mm). Advantageously, by placing the local minimum spacing at r=148 mm, any contact between the outer perimeter of the workpiece and the upper surface of the support plate will tend to occur within or at the boundary of the outer exclusion zone of the workpiece, within which no devices are formed. Alternatively, however, the radial distance of the local minimum spacing and the edge gap measurement method may be varied, if desired.

Thus, in the present embodiment, by removing the removable edge portion 58 and replacing it with similarly shaped removable edge portions having different respective heights, the edge gap 54 can be adjusted. More particularly, in this embodiment there are ten such removable edge portions, which can be substituted for one another to vary the edge gap 54 from $3 \times 10^{-4}$ m to $1.2 \times 10^{-3}$ m, in increments of $1 \times 10^{-4}$ m. Alternatively, or in addition, such removable edge portions may also be used to move the contact point (where the outer perimeter of the workpiece will impact the support plate) radially inward and outward, rather than merely upward or downward.

Also in this embodiment, the removable central portion 60 includes a planar quartz disc, mounted on top of the support plate 42 by gravity or any other means suitable for heat-treating and removability. The removable central portion 60 can be removed and replaced with other interchangeable removable planar quartz discs (not shown), having different heights than the removable central portion 60 shown in FIG. 4, thereby adjusting the central gap 56. More particularly, in this embodiment there are fourteen such removable central portions 60, which can be substituted for one another to vary the central gap 56 from $1.2 \times 10^{-3}$ to $2.5 \times 10^{-3}$ m, in increments of $1 \times 10^{-4}$ m.

Alternatively, in other embodiments, the edge gap and the central gap may be variable over greater or smaller ranges, in coarser or finer increments. Or, as a further alternative, the edge gap and the central gap may be varied by substituting different replaceable upper surfaces for substantially all of the upper surface 44 of the support plate 42, as discussed below in connection with other embodiments.

In this embodiment, as the removable central portion 60 is disc-shaped, the spacing between the upper surface 44 of the support plate 42 and the lower surface 20 of the workpiece 106 is constant and is equal to the central gap 60 above the entire disc-shaped central portion 60, which in this embodiment extends from the central axis of the workpiece (r=0) to about two-thirds of the radius of the workpiece (r=100 mm). Extending radially outward beyond the outer boundary of the disc-shaped removable central portion 60, from about r=100 mm to about r=125 mm, the upper surface 44 of the support plate 42 is then defined by an intermediate portion of the support plate 42, to define an intermediate gap 62 between the upper surface 44 of the support plate and the lower surface 20 of the workpiece, in a zone interposed radially between the removable central portion 60 and the removable edge portion 58. In this embodiment, the intermediate gap 62 is not adjustable, although it may be adjustable in other embodiments if desired. Extending radially outward beyond this intermediate portion, from about r=125 mm to about r=155 mm (slightly beyond the outer edge of the workpiece), the upper surface 44 of the support plate is then defined by an upper surface of the removable edge portion 58, which defines the edge gap 54.

Advantageously, the adjustability of the edge gap 54 and the central gap 56 in such an embodiment facilitates empirical testing of different edge gaps and central gaps, to identify the optimal edge gap and central gap values to minimize workpiece breakage for a particular thermal cycle, in accordance with the teachings of the present specification.

Figure 5:
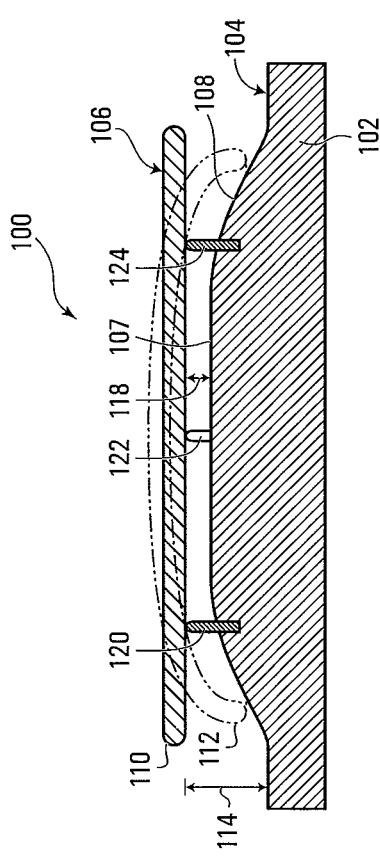
FIG. 5 is a central cross-section of an apparatus for supporting a workpiece according to a third embodiment of the invention.

Referring to FIG. 5, an apparatus for supporting a workpiece during heat-treating according to a third embodiment of the invention is shown generally at 100. In this embodiment, the apparatus 100 includes a support plate 102 having a non-planar upper surface shown generally at 104, and a support system. In this embodiment, the support system is configured to support the workpiece 106 above the support plate 102, such that the lower surface 20 of the initial shape 110 of the workpiece 106 is supported at a non-uniform spacing above the non-planar upper surface 104 of the support plate. This non-uniform spacing includes an edge gap 114 beneath an outer perimeter of the workpiece, and a central gap 118 at a central axis of the workpiece.

In this embodiment, the workpiece 106 includes a semiconductor wafer, and the support plate 102 includes a quartz plate. More particularly, in this embodiment the semiconductor wafer is intended to be supported above the support plate while being heat-treated in a manner that thermally induces motion of the workpiece. More particularly still, as discussed earlier herein, while supported above the support plate 102, the workpiece 106 is first pre-heated to an intermediate temperature, following which only the upper surface 18 of the workpiece is heated to a desired temperature greater than the intermediate temperature, in less than a thermal conduction time of the workpiece. As discussed earlier herein, such heat-treatment causes the workpiece 106 to thermally deform from its initial shape 110 to an expected thermally deformed shape such as that shown at 112 in FIG. 5 (or at 30, 32, 34 and 36 in FIGS. 2B-2E), for example. Alternatively, however, different types of workpieces, support plates and heat-treating methods may be substituted.

In the present embodiment, the upper surface 104 is configured such that the edge gap 114 is larger than the central gap 118. More particularly, in this embodiment the edge gap 114 is at least twice as large as the central gap 118. More particularly still, in this embodiment the edge gap 114 is at least three times as large as the central gap 118.

In this embodiment, the central gap 118 is less than or equal to about one millimeter. More particularly, in this embodiment the central gap 118 is one millimeter, and the edge gap 114 is three millimeters. Alternatively, other non-uniform spacing relationships between the upper surface 104 and the initial shape of the workpiece 106 may be substituted if desired.

Advantageously, in the present embodiment the upper surface 104 is shaped to counteract the "first wafer" effect discussed earlier herein, which in conventional systems would tend to produce an undesirably large temperature gradient in the workpiece 106. To achieve this, in this embodiment the non-uniform spacing between the lower surface 20 of the workpiece and the non-planar upper surface 104 of the support plate minimizes spatial variations in heat loss rates across the workpiece 106 when an expected non-uniform temperature distribution exists in the support plate 102.

In this regard, in the present embodiment, the heat loss mechanisms experienced by the workpiece 106 include both radiative losses and conductive heat transfer between the workpiece 106 and the upper surface 104. Although conductive heat transfer may be significantly less than radiative heat losses in conventional systems in which the workpiece is spaced far apart from the support plate, conductive heat transfer may be comparable to or in some cases greater than radiative heat losses in the illustrative embodiments discussed herein, in which the workpiece is closely spaced from the support plate. Conductive heat transfer between the workpiece 106 and the upper surface 104 is directly proportional to the temperature difference between the workpiece and the upper surface 104, and is inversely proportional to the spacing between the workpiece and the upper surface 104. In contrast, as a first-order approximation, the rate of radiative heat loss does not vary with the spacing between the workpiece and the upper surface 104 (although this first-order approximation becomes less accurate at the outer edges of the workpiece).

In this embodiment, the expected non-uniform temperature distribution in the support plate 102 includes a temperature which is roughly constant over an inner or central region of the support plate, and which decreases as radial distance from the central region increases. As discussed earlier herein, the support plate 102 will typically be cooler than the workpiece 106 during heat-treating thereof, and the temperature distribution in the support plate 102 is expected to be colder and more non-uniform during the first heat-treating cycle than in subsequent cycles. Thus, if the upper surface of the support plate was planar and uniformly spaced from the initial shape 110 of the workpiece, this non-uniform temperature distribution in the support plate would tend to thermally conduct a larger amount of heat energy away from the outer region of the workpiece 106 than from the inner region of the workpiece during the pre-heating stage, thereby producing a temperature gradient in the workpiece 106, which in turn would generate thermal stress within the workpiece.

To reduce the magnitude of such thermal gradients and thermal stress, in the present embodiment the upper surface 104 of the support plate 102 is configured such that the non-uniform spacing between the upper surface 104 of the support plate and the lower surface 20 of the initial shape 110 of the workpiece 106 varies as a function of radial distance from a central axis of the workpiece. More particularly, in this embodiment the non-uniform spacing generally varies as a non-decreasing function of the radial distance. More particularly still, in this embodiment, the central gap 118 is less than or equal to about one millimeter and the edge gap 114 is more than about two millimeters.

In this embodiment, the non-uniform spacing between the upper surface 104 of the support plate 102 and the lower surface 20 of the initial shape 110 of the workpiece 106 is substantially constant at less than a threshold radial distance from the central axis of the workpiece, and generally increases as a function of radial distance from the threshold radial distance to a radius of the workpiece. In this embodiment, the threshold radial distance is about half the radius of the workpiece. More particularly, in the present embodiment the workpiece 106 is a disc-shaped semiconductor wafer having a radius of 150 mm, and the upper surface 104 includes a disc-shaped planar central region 107 and a non-planar substantial portion 108. In this embodiment the disc-shaped planar central region of the upper surface 104 extends radially outward from a center of the upper surface (radial distance r=0) above which a center of the workpiece is supported, to the threshold radial distance, which in this embodiment is half the radius of the workpiece, r=75 mm. Also in this embodiment, the non-planar substantial portion 108 of the upper surface 104 extends from the circular boundary of the disc-shaped planar central region at r=75 mm, and curves downward as it extends radially outward to a radial distance of r=150 mm.

In the present embodiment, the spacing between the non-planar substantial portion 108 and the initial shape of the workpiece 106 ranges from a vertical distance of 1 mm at r=75 mm to a vertical distance of 3 mm at r=150 mm. Advantageously, such a spacing relationship tends to counteract the "first wafer" effect discussed earlier herein. In this regard, it will be recalled that the rate of thermal conduction between the workpiece 106 and the support plate 102 is directly proportional to the temperature difference $\Delta T$ between them, and is inversely proportional to the spacing S between them. As the expected non-uniform temperature distribution in the support plate 102 is expected to be cooler than the temperature of the workpiece 106 during the pre-heating stage, and the temperature of the upper surface 104 is expected to decrease with increasing radial distance from its disc-shaped central region, the temperature difference $\Delta T(r)$ between the upper surface 104 and the workpiece 106 is expected to generally increase with radial distance r, as r ranges from the radial distance of r=75 mm at the boundary of the disc-shaped central region to the radial distance of r=150 mm at the outer perimeter of the workpiece. In this embodiment, to prevent this spatially increasing temperature difference $\Delta T(r)$ from translating into spatially increasing thermal conduction, the vertical spacing S(r) between the upper surface 104 and the workpiece 106 also increases with radial distance r over the substantial portion 108 of the upper surface 104 (i.e., from r=75 to r=150 mm), so that $\Delta T(r)/S(r)$ remains approximately constant for all r, thereby tending to maintain approximately constant thermal conduction rates between the upper surface 104 and the workpiece 106. As noted, as a first-order approximation, the rate of radiative heat loss from the workpiece 106 is approximately independent of the vertical spacing between the upper surface 104 and the workpiece 106. Thus, in the present embodiment, the tendency of the expected non-uniform temperature distribution in the support plate 102 to induce a thermal gradient in the workpiece 106 is significantly reduced, thereby significantly reducing thermal stress in the workpiece 106.

Alternatively, if desired, rather than seeking to maintain $\Delta T(r)/S(r)$ constant thereby maintaining constant thermal conduction loss rates, the upper surface 104 may be shaped to even more accurately maintain constant heat loss rates across the entire workpiece 106. For example, the spacing S(r) may be controlled to maintain $R(r)+\Delta T(r)/S(r)$ constant, where R(r) is a more accurate prediction of the actual total heat loss experienced by the workpiece 106 as a function of radial distance r. If desired, R(r) may take into account "edge effects" whereby the workpiece tends to lose more energy at its outer edges via radiation, conduction and convection, due to the greater exposed surface area per unit mass at the outer edges. In such an embodiment, the upper surface 104 may be configured so that the spacing S(r) between the upper surface 104 and the initial shape 110 of the workpiece causes correspondingly greater conductive heat losses at inner regions of the workpiece than at its edges, resulting in a non-uniform conduction rate distribution to compensate for the non-uniform energy loss rate distribution that would otherwise have existed, thereby arriving at a substantially uniform total heat loss rate across the workpiece.

Referring to FIGS. 2 and 5, the relatively small size of the central gap 118 (one millimeter) in the present embodiment may result in an increased chance that the central region 33 of the workpiece 106 will impact upon the upper surface 104 of the support plate 102, when the workpiece 106 assumes the fourth thermally deformed shape 36 shown in FIG. 2E. However, the same small size of the central gap 118 also results in enhanced compensation for the "first wafer" effect as discussed above, as well as enhanced gas-pressure damping of workpiece motion by gas pressure between the workpiece and the support plate, as discussed in greater detail in the above-noted commonly owned U.S. patent publication no. US 2005/0133167. Accordingly, while the latter benefits are deemed to outweigh the impact risk in the present embodiment, the same balancing may not be true for different embodiments with different thermal cycles and potentially more violent impacts between the central region 33 of the workpiece 106 and the support plate 102.

In the present embodiment, the substantial portion 108, which is non-planar and is configured to be non-uniformly spaced from the initial shape 110 of the workpiece, includes a portion of the upper surface above which an outermost one-sixth of the area of the workpiece is to be supported. More expansively, in this embodiment the substantial portion 108 of the upper surface 104 includes a portion of the upper surface above which an outermost one-fifth of the area of the workpiece is to be supported. More expansively still, in this embodiment the substantial portion 108 includes a portion of the upper surface above which an outermost one-quarter of the area of the workpiece is to be supported. More expansively still, in this embodiment the substantial portion 108 includes a portion of the upper surface above which an outermost one-third of the area of the workpiece is to be supported. More expansively still, in this embodiment the substantial portion includes a portion of the upper surface above which an outermost one-half of the area of the workpiece is to be supported. More expansively still, in this embodiment the substantial portion 108 includes a portion of the upper surface above which an outermost two-thirds of the area of the workpiece is to be supported. More expansively still, in this embodiment the substantial portion 108 includes a portion of the upper surface above which an outermost three-quarters of the area of the workpiece is to be supported. In this regard, it will be recalled that in the present embodiment, the non-planar substantial portion 108 extends from a radial distance of r=75 mm from the central axis of the workpiece, to the outer radius of the workpiece, i.e. r=150 mm from the central axis. Thus, as the outer one-half of the radius of the workpiece 106 is supported above the non-planar substantial portion 108, three-quarters of the surface area of the workpiece 106 is supported above the non-planar substantial portion 108.

Alternatively, the non-planar substantial portion 108 may include more or less of the upper surface 104, and may include different non-planar shapes or configurations.

Advantageously, in this embodiment the upper surface 104 of the support plate 102 has a shape complementary to the expected thermally deformed shape 112 of the workpiece 106. More particularly, in this embodiment at least some of the upper surface 104 of the support plate is generally FRISBEE™ or saucer-shaped. More particularly still, in this embodiment a portion of the upper surface 104 extending from a central axis (r=0) of the workpiece to beneath an outer perimeter of the workpiece (r=150 mm) is generally saucer-shaped. In this regard, when the upper surface 18 of the workpiece 106 is heated to the desired temperature in less than a thermal conduction time of the workpiece, while the bulk of the workpiece remains at the cooler intermediate temperature, the increased thermal expansion of the upper surface 18 of the workpiece relative to the bulk of the workpiece causes it to deform to the expected thermally deformed shape 112 shown in FIG. 4. In this embodiment, due to the shape of the upper surface 104, the outer perimeter of the workpiece 106 does not strike the upper surface 104 when it initially thermally deforms to the expected thermally deformed shape 112. The absence of such contact may improve the likelihood of survival of the workpiece 106 if the workpiece is scratched or otherwise damaged, as such scratches tend to increase the likelihood of Type I breakage. Conversely, however, in the absence of such scratches or other damage, a controlled impact between the workpiece 106 and the upper surface 104 as the workpiece initially thermally bows into the thermally deformed shape 112 may be desirable, as such contact may reduce overall workpiece motion, thereby reducing the likelihood of Type I or Type II breakage of the workpiece 106.

In this embodiment, the workpiece 106 is supported above the support plate 102 by the support system. In this embodiment, the support system includes a plurality of support pins, three of which are shown at 120, 122 and 124 in FIG. 4. In the present embodiment, the support system of the apparatus 100 further includes a fourth such support pin (not shown in the cross-section of FIG. 4), with the four pins being disposed symmetrically about and equidistantly from a center of the support plate 102 above which a center of the workpiece 106 is supported. In this embodiment, the support pins include quartz support pins. More particularly, in this embodiment each of the quartz pins has a fire-polished upper tip, to reduce the likelihood of scratching the workpiece 106 during thermally induced motion of the workpiece.

In this embodiment, each of the support pins is located at a radial distance of about two-thirds to about three-quarters of the radius of the workpiece. More particularly, in the present embodiment, in which the workpiece has a radius of 150 mm, each of the quartz support pins is located at a radial distance of r=110 mm from a central axis of the workpiece. In this regard, for some specific thermal heat-treating cycles involving 150 mm radius semiconductor wafers, the least amount of thermally induced motion may occur at approximately this radial distance, r=110±5 mm. Alternatively, however, other radial distances may be more suitable for other heat-treating cycles and/or for other types of workpieces.

Also in this embodiment, each of the quartz pins has a diameter of 1.5 mm, and is free-standing within a respective hole in the support plate 102, to reduce the extent to which the pins may contribute to thermal coupling between the support plate and the workpiece. Alternatively, if desired, the pins may be free-standing within an annular channel defined in the support plate (not shown in this embodiment; discussed below in connection with a further embodiment). If desired, the quartz pins may be provided with a flange (not shown in this embodiment) at a bottom region thereof, the flange having a diameter exceeding that of the hole (or of the annular channel, in alternative embodiments), to prevent the pins from jumping out of the hole or channel in response to reaction forces resulting from the thermally induced motion of the workpiece. Or as a further alternative, the pins may be rigidly attached to or formed integrally with the support plate 102. More generally, any other suitable means for supporting the workpiece above an upper surface of a support plate such that at least a non-planar substantial portion of the upper surface is non-uniformly spaced from an initial shape of the workpiece, may be substituted for any of the support pins described herein.

Figure 6:
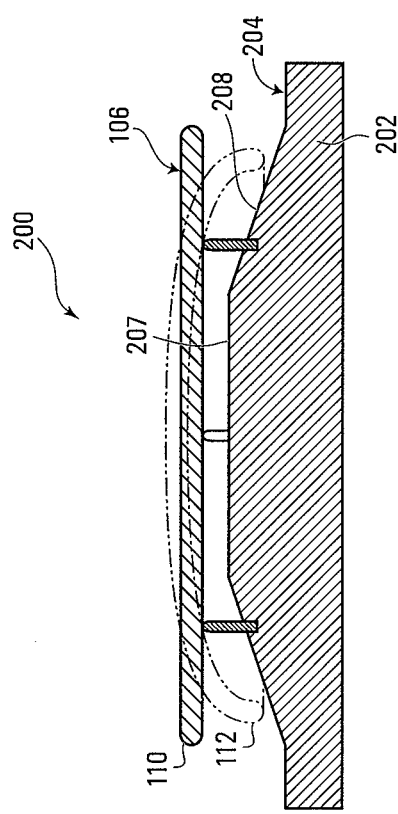
FIG. 6 is a central cross-section of an apparatus for supporting a workpiece according to a fourth embodiment of the invention.

Referring to FIG. 6, an apparatus according to a fourth embodiment of the invention is shown generally at 200. As with the previous embodiment, the apparatus 200 includes a support plate 202 having a non-planar upper surface 204, and a support system configured to support the workpiece 106 above the support plate 202 during heat-treating of the workpiece, such that the lower surface 20 of the initial shape 110 of the workpiece is supported at a non-uniform spacing above the non-planar upper surface 204 of the support plate, the non-uniform spacing including an edge gap beneath an outer perimeter of the workpiece, and a central gap at a central axis of the workpiece.

In this embodiment, at least a substantial portion 208 of the upper surface 204 is non-planar and is configured to be non-uniformly spaced from the initial shape 110 of the workpiece 106. However, in this embodiment the shape of the upper surface 204, and in particular the shape of the substantial portion 208, differs from the previous embodiment.

More particularly, in this embodiment the upper surface 204 is beveled. Thus, in this embodiment, at least some of the upper surface 204 of the support plate 202 is generally frustoconical-shaped.

In the present embodiment, the upper surface 204 includes a disc-shaped planar central region 207, configured to be spaced a uniform vertical distance from the planar initial shape 110 of the workpiece 106. At a threshold radial distance from a central axis of the workpiece 106, the upper surface 204 transitions from the disc-shaped planar central region 207 to the substantial portion 208, which slopes downwardly at a constant slope angle as it extends radially outwardly from the central axis of the workpiece. Thus, the central region 207 and the surrounding substantial portion 208 form a generally frustoconical shape.

In this embodiment, the threshold radial distance at which the planar central region 207 transitions to the downwardly sloping non-planar substantial portion 208 is r=75 mm, and the vertical spacing between the upper surface 204 and the workpiece 106 varies from a central gap of 1 mm at the central region 207 to an edge gap of 3 mm at the outer perimeter (r=150 mm) of the substantial portion 208. Alternatively, however, different vertical spacings, and different threshold radial distances for transitioning between the planar and non-planar portions, may be substituted.

Figure 7:
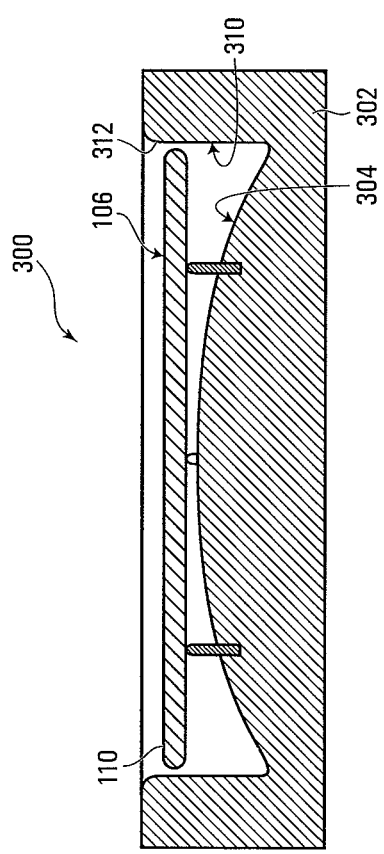
FIG. 7 is a central cross-section of an apparatus for supporting a workpiece according to a fifth embodiment of the invention.

Referring to FIG. 7, an apparatus according to a fifth embodiment of the invention is shown generally at 300. The apparatus 300 includes a support plate 302 having a non-planar upper surface 304, and a support system configured to support the workpiece 106 above the support plate 302 during heat-treating of the workpiece, such that the lower surface 20 of the initial shape 110 of the workpiece is supported at a non-uniform spacing above the non-planar upper surface 304 of the support plate, the non-uniform spacing including an edge gap beneath an outer perimeter of the workpiece, and a central gap at a central axis of the workpiece.

In this embodiment, at least a substantial portion of the upper surface 304 is non-planar and is configured to be non-uniformly spaced from the initial shape 110 of the workpiece 106.

In this embodiment, the non-planar substantial portion includes substantially all of the upper surface 304. More particularly, in this embodiment at least some of the upper surface 304 of the support plate 302 is generally dome-shaped. More particularly still, in the present embodiment, a portion of the upper surface 304 above which the entire workpiece 106 is supported is dome-shaped.

Thus, in this embodiment the upper surface 304 of the support plate 302 extends outwardly and downwardly, from the central axis to the outer perimeter of the workpiece. More particularly, in this embodiment the upper surface 304 curves downwardly as it extends outwardly from its central region to its outer region.

In the present embodiment, the upper surface 304 of the support plate includes a generally upwardly extending side wall 310, located radially outward from a perimeter region of the upper surface 304 above which an outermost perimeter of the initial shape 110 of the workpiece is to be supported. More particularly, in this embodiment the side wall 310 includes a circumscribing portion 312 extending from the perimeter region of the upper surface 304 to above a plane at which the initial shape 110 of the workpiece is to be supported. In this embodiment, the circumscribing portion 312 is configured to surround the outermost perimeter of the initial shape 110 of the workpiece in close proximity thereto when the workpiece 106 is supported above the support plate 302. Alternatively, the circumscribing portion 312 may be omitted, and the side wall may extend generally upwardly to below the plane at which the initial shape 110 of the workpiece 106 is to be supported. Alternatively, the side wall 310 may be omitted entirely. For example, the entire upper surface 304 may be dome-shaped, if desired.

In this embodiment, the spacing between the upper surface 304 and the initial shape 110 of the workpiece 106 at the central region above which the center of the workpiece is to be supported is about one-half millimeter.

Figure 8:
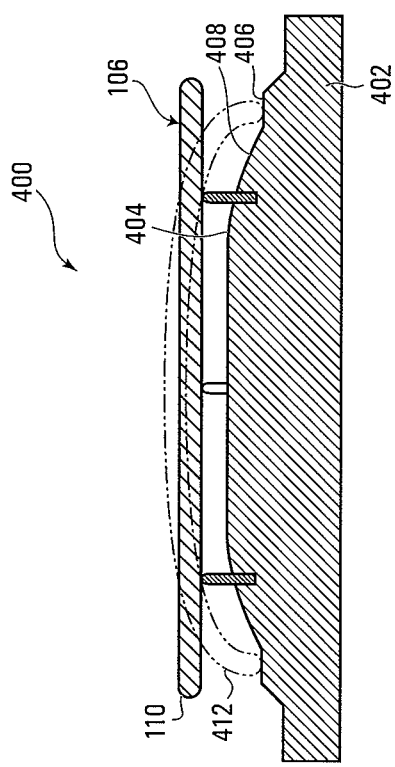
FIG. 8 is a central cross-section of an apparatus for supporting a workpiece according to a sixth embodiment of the invention.

Referring to FIGS. 5 and 8, an apparatus according to a sixth embodiment of the invention is shown generally at 400 in FIG. 8. In this embodiment, the apparatus 400 includes a support plate 402 having a non-planar upper surface 404, and a support system configured to support the workpiece 106 above the support plate 402, such that the lower surface of 20 of the initial shape 110 of the workpiece 106 is supported at a non-uniform spacing above the non-planar upper surface 404 of the support plate 402, the non-uniform spacing including an edge gap beneath an outer perimeter of the workpiece, and a central gap at a central axis of the workpiece.

As with the previously discussed embodiments, at least a substantial portion of the non-planar upper surface 404 is non-planar and is configured to be non-uniformly spaced from the initial shape 110 of the workpiece 106 when the workpiece is supported above the support plate 402.

Advantageously, in the present embodiment the upper surface 404 of the support plate 402 also includes a contact portion 406 configured to be struck by an outer perimeter of the workpiece 106 during heat treatment of the workpiece.

In this regard, in the present embodiment a controlled impact between the outer perimeter of the workpiece and the upper surface of the support plate is deemed to be desirable, to dampen overall workpiece motion, thereby reducing the risk of both Type I and Type II breaks, provided that the risk that such a controlled impact may break the workpiece does not outweigh the increased survivability chance that results from such dampening (this balancing may be different for scratched wafers, which suffer increased Type I breakage risks).

Alternatively, such a contact portion may also be provided in embodiments where an impact between the outer perimeter of the workpiece and the upper surface of the support plate is not necessarily desired, but may occur by chance as a variable of the process. For example, if the heat-treating of the workpiece 106 during a particular thermal cycle causes it to rapidly thermally deform more than expected, to an excessively thermally deformed shape 412 rather than the expected thermally deformed shape 112, then the outer perimeter of the workpiece may nevertheless strike the upper surface of the support plate.

In either case (intentional or unintentional impact), if the outer perimeter of the workpiece 106 were to curl downward and strike the outer region of the upper surface 104 shown in FIG. 5, it would do so at a location of the substantial portion 108 which is curving downwardly as it extends radially outwardly. Thus, the outer perimeter would strike the upper surface 104 with a force having downward and radially inward components, resulting in the upper surface 104 applying an equal and opposite reaction force having upward and radially outward components to the workpiece 106. The component of this reaction force in the radially outward direction places the workpiece 106 under tension. However, the present inventors have found that in embodiments in which the workpiece 106 is a semiconductor wafer, tension in the wafer is more likely to cause damage or breakage than compression.

Therefore, to reduce the likelihood that such a collision will damage or break the workpiece, in the present embodiment the contact portion 406 is configured to apply a reaction force having a radially inward component to the outer perimeter of the workpiece 106 in reaction to the outer perimeter of the workpiece striking the contact portion 406. Thus, if the outer perimeter of the workpiece 106 strikes the contact portion 406, the radially inward component of the resulting reaction force applied by the contact portion 406 to the workpiece 106 places the workpiece 106 under compression rather than under tension, thereby reducing the likelihood that the workpiece will be damaged or broken by the collision. Additionally, such a collision will stop the downward motion of the workpiece, resulting in less momentum, which in turn tends to reduce thermally induced vibration of the workpiece.

More particularly, in this embodiment the contact portion 406 is angled relative to an adjacent inward portion 408 of the upper surface. More particularly still, in this embodiment the adjacent inward portion 408 of the upper surface is angled downwardly as it extends outwardly, and the contact portion 406 is substantially horizontal, extending generally horizontally and only slightly upwardly angled as it extends radially outward from the adjacent inward portion 408. Alternatively, the contact portion 406 may be precisely horizontal, or may be otherwise angled. More generally, other angles, shapes and/or configurations of the contact portion 406 may be substituted while still ensuring that the reaction force applied by the contact portion 406 to the workpiece 106 has a radially inward component rather than a radially outward component, and may be selected based upon the angle at which the outer perimeter of the workpiece will strike the contact portion.

As discussed above in connection with FIGS. 1 and 2, the placement of the contact portion 406 may also be selected to ensure that the outer perimeter of the workpiece is not traveling at its maximum possible thermally induced velocity at the time that it impacts upon the contact portion, to reduce the magnitude of the resulting shock waves. Similarly, the placement of the contact portion may be selected to control the timing at which such shock waves will propagate through the workpiece, to avoid the shock waves reaching the central region 33 of the workpiece when the workpiece is in its higher-stress thermally deformed shapes 32 or 36.

Still referring to FIGS. 5 and 8, in the present embodiment, the upper surface 404 of the support plate 402 is configured to be spaced from the expected thermally deformed shape 112 of the workpiece 106 by a distance sufficiently small that gas pressure between the upper surface 404 and the expected thermally deformed shape 112 of the workpiece opposes thermally induced motion of the workpiece.

More particularly, in this embodiment the upper surface 404 of the support plate 402 is configured to be substantially uniformly spaced from the expected thermally deformed shape 112 of the workpiece. In this regard, by providing such close and generally uniform spacing between the upper surface 404 and the expected thermally deformed shape 112, the air gap between the upper surface 404 and the expected thermally deformed shape 112 provides significantly improved damping of thermally induced vibration of the workpiece 106, in comparison to prior systems involving planar plates. To achieve such improved damping, in the present embodiment the upper surface 404 is shaped complementary to the expected thermally deformed shape 112, having a generally dome-shaped central region, and curling downward more steeply in its outer region, in the vicinity of the adjacent inward portion 408, to mimic the expected downward curling of the outer edges of the workpiece 106 as it assumes the expected thermally deformed shape 112.

In this embodiment, the upper surface 404 of the support plate is configured to be spaced from the expected thermally deformed shape 112 of the workpiece 106 by a distance on the order of one millimeter. More particularly, in this embodiment the upper surface 404 is configured to be spaced from the expected thermally deformed shape 112 by a distance less than one millimeter. More particularly still, in this embodiment the upper surface 404 is configured to be spaced from the expected thermally deformed shape 112 by a distance of one-half millimeter.

Thus, in this embodiment the workpiece 106 is supported above the upper surface 404 such that the non-planar substantial portion of the upper surface 404 is substantially uniformly spaced from the expected thermally deformed shape 112 of the workpiece 106, at a spacing of about one-half millimeter. Advantageously, such close and uniform spacing between such a large area of the expected thermally deformed shape 112 of the workpiece and the support plate provides significantly greater gas-pressure damping of vibratory motion of the workpiece, over a much greater surface area than prior systems employing planar support plates.

Figure 9:
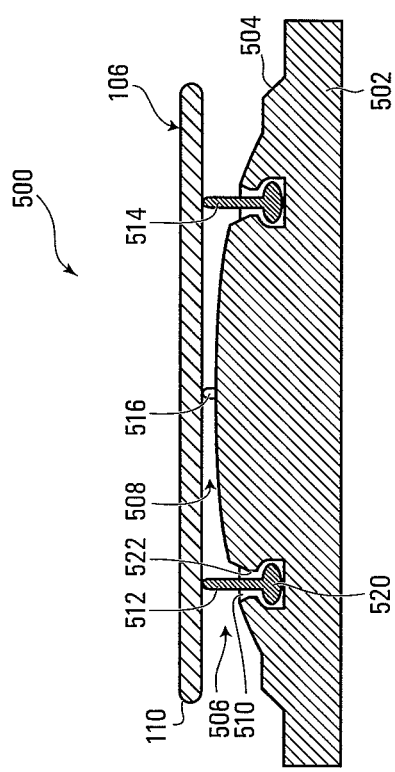
FIG. 9 is a central cross-section of an apparatus for supporting a workpiece according to a seventh embodiment of the invention.

Referring to FIGS. 8 and 9, an apparatus according to a seventh embodiment of the invention is shown generally at 500 in FIG. 9. In this embodiment, the apparatus 500 includes a support plate 502 having a non-planar upper surface 504, and a support system The support plate 502 is generally similar to the support plate 402, but in this embodiment also includes a gas flow barrier shown generally at 506. The gas flow barrier 506 is configured to resist gas flow through a gap 508 between the upper surface 504 and the workpiece 106 when the workpiece is supported above the support plate 502. In this regard, due to the rapidity with which the workpiece 106 deforms from its initial shape to its expected thermally deformed shape, the rapid deformation of the workpiece 106 may force air into the gap 508. This rapid air flow may in turn tend to blow the workpiece 106 upward from its support pins. Alternatively, or in addition, the rapid air flow may potentially be supersonic, depending upon the thermal cycle in question. Either of these effects may be viewed as undesirably increasing the likelihood of damage to the workpiece. Advantageously, therefore, in the present embodiment the gas flow barrier 506 tends to slow the air flow resulting from the rapid thermal deformation of the workpiece 106, thereby diminishing or preventing these undesirable effects.

In this embodiment, the gas flow barrier 506 includes a turbulence generator. More particularly, in this embodiment the turbulence generator includes an annular channel 510 defined in the upper surface 504 of the support plate 502. Thus, when rapid thermal deformation of the workpiece 106 forces air to flow rapidly into the gap 508, some of the rapid air flow is deflected into the annular channel 510, generating turbulence in the vicinity of the annular channel, thereby slowing the overall rate of air flow into the gap 508.

In the present embodiment, the support system of the apparatus 500 includes a plurality of support pins, such as those shown at 512, 514 and 516, for example. Preferably at least three such support pins are employed for support stability, and in this embodiment, the apparatus 500 includes four such support pins. In this embodiment, the support pins are disposed in the annular channel 510 for supporting the workpiece 106 thereupon. More particularly, in this embodiment the four support pins are disposed at 90° intervals within the annular channel 510.

In this embodiment, the support pins are free-standing within the annular channel 510, to reduce the extent to which the pins may contribute to thermal coupling between the support plate 502 and the workpiece 106. Also in this embodiment, the support pin 512 includes a flange 520 at a bottom region thereof, and each of the other support pins includes a similar flange at a respective bottom region thereof. In this embodiment, the flange 520 has a rounded or curved bottom surface rather than a flat planar bottom surface, to further reduce thermal coupling. At least a portion 522 of the annular channel 510 is narrower than the flange 520 to prevent the flange from exiting the channel. An insertion hole (not shown) wider than the flange may be drilled at a single location in the annular channel 510 to allow insertion and removal of the support pins.

In the present embodiment, each of the support pins comprises a quartz pin having a diameter of 1.5 mm and a fire-polished upper tip to reduce the likelihood of scratching the workpiece 106.

In this embodiment, the annular channel 510 is disposed at a radial distance of about two-thirds to about three-quarters of a radius of the workpiece 106, from a center of the support plate 502 above which a center of the workpiece 106 is to be supported. More particularly, in the present embodiment the workpiece 106 is a 150 mm radius semiconductor wafer, and the annular channel 510 is disposed at a radial distance of approximately 110±5 mm from the central axis of the workpiece 106. Alternatively, the annular channel 510 may be disposed at other radial distances. More generally, other types of gas flow barriers may be substituted for the annular channel 510.

Figure 10:
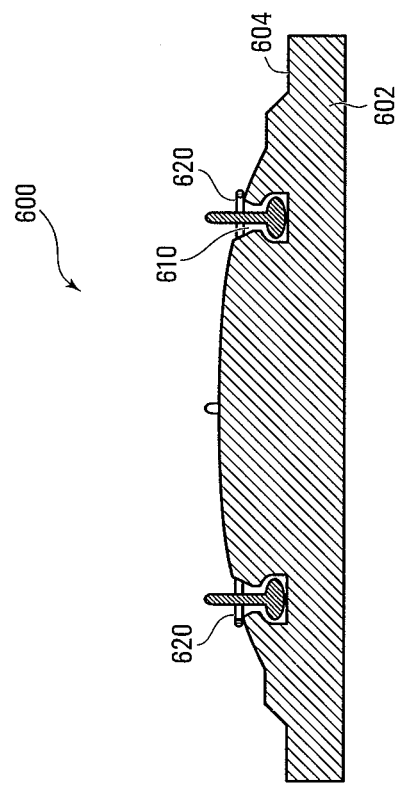
FIG. 10 is a central cross-section of an apparatus for supporting a workpiece according to an eighth embodiment of the invention.

Referring to FIGS. 9 and 10, an apparatus according to an eighth embodiment of the invention is shown generally at 600 in FIG. 10. The apparatus 600 includes a support plate 602. In this embodiment the support plate 602 includes an annular channel 610 similar to the annular channel 510, and the support plate 602 is similar in some other respects to the support plate 502. However, in this embodiment the apparatus 600 further includes an additional gas flow barrier, namely, a ring 620 surrounding the support pins. Also in this embodiment, an upper surface 604 of the support plate is shaped slightly differently in the vicinity of the outer boundary of the annular channel in which the support pins are disposed, in order to assist in supporting the ring 620.

In this embodiment, the ring 620 comprises an optical fiber ring. More particularly, in this embodiment the ring 620 comprises optical quartz fiber having a diameter of 1.5 mm. Alternatively, a bundle of smaller-diameter optical fibers may be substituted. Or as a further alternative, other suitable types of rings may be substituted. As yet a further illustrative alternative, the ring may be integrally formed with the support plate. More generally, other types of gas flow barriers may be substituted.

Figure 11:
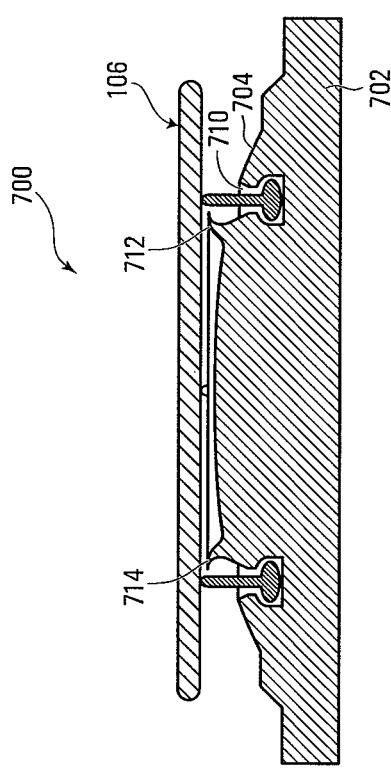
FIG. 11 is a central cross-section of an apparatus for supporting a workpiece according to a ninth embodiment of the invention.

Referring to FIGS. 9 and 11, an apparatus according to a ninth embodiment of the invention is shown generally at 700 in FIG. 11. The apparatus 700 includes a support plate 702, which includes an annular channel 710 similar to the annular channel 510, and the support plate 702 is also similar in some other respects to the support plate 502. However, in this embodiment the apparatus 700 further includes an additional gas flow barrier, namely, an elevated portion 712 of an upper surface 704 of the support plate 702. The elevated portion 712 protrudes upwardly above adjacent portions of the upper surface 704. More particularly, in this embodiment the elevated portion 712 protrudes upwardly at a location adjacent and radially inward from the annular channel 710. In this embodiment, the elevated portion 712 includes a deflecting surface 714, shaped to deflect incoming air downward into the annular channel 710. In the present embodiment, the elevated portion 712 is located as close to the support pins within the annular channel 710 as possible, so that the support pins prevent the workpiece 106 from striking the elevated portion 712 during thermally induced motion of the workpiece. Also in this embodiment, the radial length of the elevated portion 712 is as small as possible while providing sufficient strength to prevent its breakage in response to rapid incoming air flow created by thermally induced motion of the workpiece, in order to minimize thermal coupling between the elevated portion 712 and the workpiece 106 during pre-heating of the workpiece. Alternatively, the elevated portion may be differently shaped and/or located.

Figure 12:
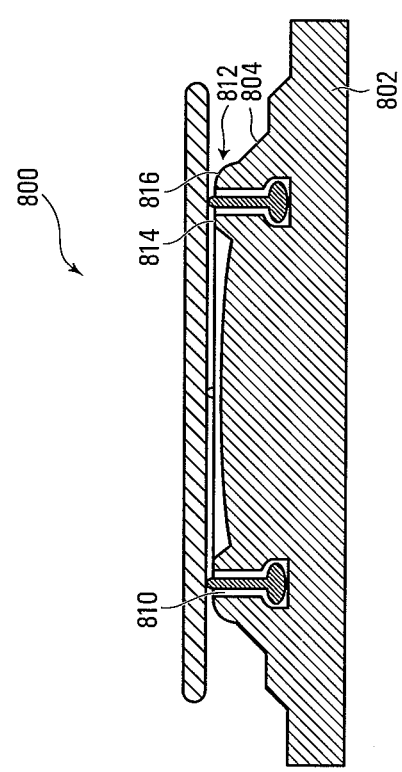
FIG. 12 is a central cross-section of an apparatus for supporting a workpiece according to a tenth embodiment of the invention.

Referring to FIGS. 11 and 12, an apparatus according to a tenth embodiment of the invention is shown generally at 800 in FIG. 12. The apparatus 800 includes a support plate 802 which is generally similar to the support plate 702. Thus, in this embodiment the support plate 802 includes, as an additional gas flow barrier, an elevated portion shown generally at 812, protruding upwardly above adjacent portions of an upper surface 804 of the support plate 802. In this embodiment, however, the elevated portion 812 comprises an inner elevated portion 814 and an outer elevated portion 816 on opposite sides of an annular channel 810 in which the support pins are disposed. The inner and outer elevated portions 814 and 816 are located as close as possible to the annular channel 810, so that the support pins in the channel prevent the workpiece 106 from striking the elevated portions 814 and 816 during thermally induced motion. The radial lengths of the elevated portions 814 and 816 are also minimized subject to strength constraints, to minimize thermal coupling between the elevated portions and the workpiece 106 during pre-heating of the workpiece.

Figure 13:
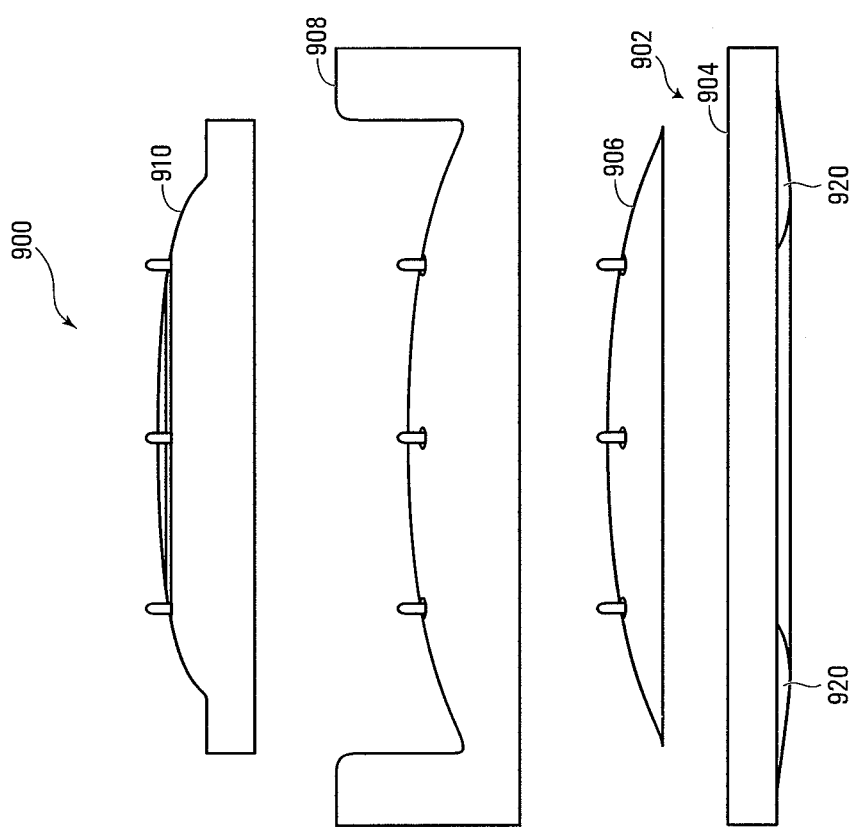
FIG. 13 is a front elevation view of an apparatus for supporting a workpiece according to an eleventh embodiment of the invention.

Referring to FIGS. 5 and 13, an apparatus according to an eleventh embodiment of the invention is shown generally at 900 in FIG. 13. In this embodiment, the apparatus 900 includes a support plate shown generally at 902.

In the present embodiment, the support plate 902 includes a removable portion comprising at least some of the upper surface of the support plate. More particularly, in this embodiment the support plate 902 includes a lower portion 904 and an upper portion 906, and the upper portion 906 is removable from the lower portion 904. In this embodiment, the upper portion 906 is attachable to the lower portion 904, to form the resulting support plate 902, which is similar to the support plate 102 shown in FIG. 5.

The upper portion 906 may be attached to the lower portion 904 in any manner suitable for heat-treating and removability. For example, in this embodiment, the upper portion 906 has a flat planar lower surface, which is complementary to a flat planar upper surface of the lower portion 904. Accordingly, when the upper portion 906 is placed on top of the lower portion 904, gas pressure, gravity and friction between these two complementary surfaces tend to retain the upper and lower portions attached together. Alternatively, any suitable optical adhesive may be used to attach the upper and lower portions. More generally, other ways of attaching the upper and lower portions may be substituted.

In this embodiment, the upper portion 906 includes at least part of the upper surface of the support plate 902 formed by attaching the upper portion 906 to the lower portion 904. However, in this embodiment the upper portion 906 does not include the entire upper surface of the resulting support plate 902. Rather, when the upper portion 906 is attached to the lower portion 904 to form the support plate 902, the upper surface of the resulting support plate 902 includes the entire upper surface of the upper portion 906, as well as an outer portion of the upper surface of the lower portion 904 at radial distances exceeding the radius of the upper portion 906. Alternatively, however, the upper portion 906 may have a radius equal to or greater than that of the lower portion 904, so that the upper surface of the upper portion 906 forms the entire upper surface of the support plate 902 formed by attaching the upper portion 906 to the lower portion 904.

Referring to FIGS. 7 and 13, in this embodiment the apparatus 900 further includes a second upper portion 908 having a differently shaped upper surface than that of the upper portion 906. The second upper portion 908 is interchangeable with the upper portion 906 to change a shape of the upper surface of the support plate 902. In this embodiment, the second upper portion 908 has an upper surface shaped similar to the upper surface 304 of the support plate 302 shown in FIG. 7.

Referring to FIGS. 9 and 13, in this embodiment the apparatus 900 further includes a third upper portion 910 having a differently shaped upper surface than that of either the upper portion 906 or the second upper portion 908. The third upper portion 910 is interchangeable with the upper portion 906 or the second upper portion 908 to change a shape of the upper surface of the support plate 902. In this embodiment, the third upper portion 910 has an upper surface shaped similar to the upper surface 504 of the support plate 502 shown in FIG. 9.

Thus, in this embodiment the apparatus 900 includes a plurality of upper portions each having a uniquely shaped upper surface, and each of the plurality of upper portions is interchangeable with each other of the upper portions to change a shape of the upper surface of the support plate 902. If desired, the apparatus 900 may also include additional upper portions having additional uniquely shaped upper surfaces.

Advantageously, therefore, if a user of the apparatus wishes to apply a plurality of different thermal heat-treating cycles to a plurality of similar workpieces, resulting in different expected thermally deformed shapes of the workpieces, the user may simply remove one upper portion and attach a differently shaped upper portion to the lower portion 904, thereby changing the resulting shape of the upper surface of the support plate 902, to correspond to the expected thermally deformed shape of the workpiece for a particular thermal cycle. Similarly, such interchangeability may be equally advantageous in other situations where the expected thermally deformed shape of one workpiece during heat-treating will be different than that of another (for example, the application of similar heat-treating cycles to different types of workpieces, or different heat-treating cycles to different types of workpieces).

In this embodiment, the support plate 902 includes a lensing portion 920 configured to provide a desired lensing effect to electromagnetic radiation being transmitted through the support plate to the workpiece. More particularly, in this embodiment the lower portion 904 of the support plate 902 includes the lensing portion 920.

In the present embodiment, the purpose of the lensing portion 920 is to compensate for a lensing effect of the non-uniform upper surface of the support plate 902 upon electromagnetic radiation being transmitted through the support plate 902 to pre-heat the workpiece.

In this embodiment, the lensing portion 920 includes an annular lens shape on a lower surface of the lower portion 904. More particularly, in this embodiment the lensing portion is an annular quartz lens formed integrally with the lower surface of the lower portion 904. Although the lensing portion 920 is illustrated in FIG. 13 as a protrusion beneath the remainder of the lower surface of the lower portion 904, alternatively, the lensing portion may be formed in other ways. For example, the lensing portion may be formed as an indentation or recess in the lower surface of the lower portion 904, or by otherwise modifying the shape of the lower surface of the lower portion 904.

In this embodiment, the lensing portion 920 is shaped to compensate for an average lensing effect of the various attachable upper portions such as those shown at 906, 908 and 910. Alternatively, if desired, the lensing portion 920 may be removable, and different respective lensing portions (not shown) corresponding to each of the different attachable upper portions may be provided. Thus, a different respective lensing portion may be attached to the lower surface of the lower portion 904 for each respective upper portion 906, 908 or 910. Or, as a further alternative, a plurality of interchangeable lower portions with uniquely shaped respective lensing portions may be provided. As a further alternative still, each uniquely shaped upper portion may be provided with its own respective uniquely shaped lensing portion. For example, each unique lensing portion may be formed as an indentation in the lower surface of each respective upper portion, so that each upper portion includes its own integral lensing correction.

Or, as yet another alternative, referring to FIGS. 1-13, any one of the support plates 12, 42, 102, 202, 302, 402, 502, 602, 702 or 802 may be provided with a respective lensing portion, either integral with or removable from its respective support plate.

More generally, other types, configurations and locations of suitable lensing portions may be substituted.

Figure 14:
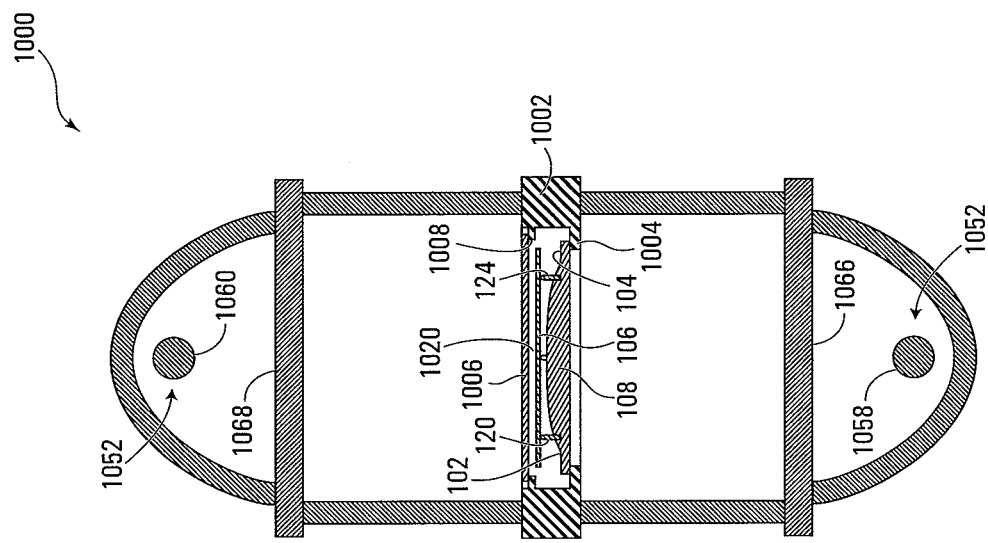
FIG. 14 is a central cross-section of an apparatus for supporting a workpiece according to a twelfth embodiment of the invention.

Referring to FIGS. 5 and 14, an apparatus according to a twelfth embodiment of the invention is shown generally at 1000 in FIG. 14. In this embodiment, the apparatus 1000 includes the support plate 102 shown in FIG. 5, for supporting the workpiece 106 thereabove. More particularly, in this embodiment the apparatus 1000 includes a workpiece plane plate 1002, having a lower annular inwardly-protruding supporting edge 1004, for supporting the support plate 102. In the present embodiment the apparatus 1000 also includes means for supporting the workpiece 106 above the support plate 102 during heat-treating of the workpiece, such that the lower surface 20 of the initial shape 110 of the workpiece 106 is supported at a non-uniform spacing above the non-planar upper surface 104 of the support plate 102, the non-uniform spacing including the edge gap 114 and the central gap 118 shown in FIG. 5. More particularly, in this embodiment the means for supporting the workpiece include a plurality of support pins, such as the support pins 120, 122 and 124. Alternatively, other suitable means for supporting the workpiece, such as the support system 15 shown in FIG. 1 for example, may be substituted.

In this embodiment, the apparatus 1000 further includes a second plate 1006, disposed above a plane at which the apparatus 1000 is configured to support the initial shape 110 of the workpiece 106. In the present embodiment, the second plate 1006 is supported by an upper annular inwardly-protruding supporting edge 1008 of the workpiece plane plate 1002.

In the present embodiment, a spacing 1020 between the upper surface 18 of the initial shape 110 of the workpiece 106 and a lower surface of the second plate 1006 is comparable to the spacing between the upper surface 104 of the support plate 102 and the lower surface 20 of the initial shape 110 of the workpiece 106. More particularly, in this embodiment the spacing 1020 is on the order of one millimeter. Alternatively, however, the spacing 1020 may be greater than or less than the spacing between the upper surface 104 and the workpiece 106; however, in embodiments such as the present embodiment in which the workpiece 106 is a semiconductor wafer whose upper surface 18 is a device side, the spacing 1020 is preferably sufficiently large to avoid physical contact between the upper surface (device side) 18 of the workpiece and the second plate 1006 when the workpiece thermally deforms to its expected thermally deformed shape 112. For example, for the purpose of the thermal cycles discussed for illustrative purposes in connection with the present embodiment, the spacing 1020 is preferably at least 0.5 mm, although more generally, the preferred spacing may vary based on the parameters of the particular thermal cycle in question.

In addition to providing an enhanced damping force, the presence of both the support plate 102 and the second plate 1006 in close proximity to the wafer tends to reduce gas throughput in the vicinity of the workpiece, which tends to reduce convection and contamination problems.

Alternatively, the second plate 1006 may be omitted if desired.

In this embodiment, the apparatus 1000 further includes a heat-treating system shown generally at 1052, for heat-treating the workpiece 106. More particularly, in this embodiment the heat-treating system is configured to thermally induce motion of the workpiece 106. In this regard, in the present embodiment, the heat-treating system 1052 is configured to pre-heat the workpiece 106 to an intermediate temperature, and is configured to then heat only a surface region of the workpiece 106 to a desired temperature greater than the intermediate temperature in less than a thermal conduction time of the workpiece. More particularly, in this embodiment the heat-treating system 1052 includes a pre-heating system configured to pre-heat the workpiece to the intermediate temperature, and a surface heating system configured to heat only the surface region of the workpiece to the desired temperature. In this embodiment, each of the pre-heating system and the surface heating system includes a respective irradiance system. More particularly, in this embodiment the pre-heating system includes a DC arc lamp 1058, and the surface heating system includes at least one irradiance flash device configured to expose the workpiece 106 to an irradiance flash. More particularly still, in this embodiment the irradiance flash device includes a flash lamp 1060, configured to produce an irradiance flash consisting primarily of visible and infrared wavelengths. Alternatively, the irradiance flash device may include a microwave pulse generator configured to produce an irradiance flash consisting primarily of microwave wavelengths. In this embodiment, the DC arc lamp 1058 is configured to irradiate the lower surface 20 of the workpiece 106 through a quartz window 1066 and through the quartz support plate 102, and similarly, the flash lamp 1060 is configured to irradiate the upper surface 18 of the workpiece 106 through a quartz window 1068 and through the second plate 1006. Generally, in the present embodiment, the various components of the heat-treating system of the apparatus 1000 other than the support plate 102 are similar to corresponding components of heat-treating systems disclosed in the aforementioned commonly owned United States Patent Application Publication No. US 2005/0133167. Alternatively, however, other suitable heat-treating systems and/or components thereof may be substituted.

Still referring to FIGS. 5 and 14, in operation of the embodiment shown in FIG. 14, the workpiece 106 is supported above the upper surface 104 of the support plate 102 such that at least the non-planar substantial portion 108 of the upper surface 104 of the support plate is non-uniformly spaced from the initial shape 110 of the workpiece 106. In this embodiment, the workpiece 106 is supported in this manner while heat-treating the workpiece. More particularly, in this embodiment the heat-treating includes both a pre-heating stage and a surface heating stage which includes thermally inducing motion of the workpiece.

During the pre-heating stage, the DC arc lamp 1058 is activated to pre-heat the workpiece 106 to a desired intermediate temperature, by irradiating the workpiece through the quartz window 1066 and the support plate 102. During this pre-heating stage, as discussed above in connection with FIG. 5, the initial shape 110 of the workpiece is supported above the upper surface 104 of the support plate 102 at a non-uniform spacing therebetween that minimizes spatial variations in heat loss rates across the workpiece 106 when an expected non-uniform temperature distribution exists in the support plate 102. Advantageously therefore, in this embodiment the "first wafer" effect discussed earlier herein is thereby minimized.

When the workpiece arrives at the intermediate temperature, the surface heating stage of the heat-treating cycle then includes thermally inducing motion of the workpiece. More particularly, thermally inducing motion of the workpiece includes heating only a surface region of the workpiece to a desired temperature in less than a thermal conduction time of the workpiece, thereby deforming the workpiece from the initial shape to a thermally deformed shape. To achieve this, in this embodiment the flash lamp 1060 is activated, to expose the upper surface 18 of the workpiece 106 (which in this embodiment is the device side of a semiconductor wafer) to a high intensity electromagnetic radiation flash, through the quartz window 1068 and the second plate 1006. The high intensity irradiance flash has a duration significantly less than a thermal conduction time of the workpiece, such as a 1 ms flash, for example. The irradiance flash heats only the upper surface 18 of the workpiece to the desired temperature, while the bulk of the workpiece remains at the relatively cooler intermediate temperature. Due to the rapid thermal expansion of the heated upper surface 18 of the workpiece, the upper surface 18 thermally expands more than the bulk of the workpiece, thereby causing the workpiece to thermally deform from its initial shape 110 to its expected thermally deformed shape 112. The rapidity at which this thermal deformation occurs also causes the workpiece to overshoot its equilibrium deformed shape, and to oscillate or vibrate.

In this embodiment, supporting the workpiece 106 includes controlling contact between the workpiece 106 and the upper surface 104 of the support plate 102 when the workpiece 106 thermally deforms from the initial shape 110 to its expected thermally deformed shape 112. Manners of such control have been discussed earlier herein, and include, for example, positioning the upper surface 104 to reduce or limit the velocity of the outer perimeter of the workpiece at the time that it impacts the upper surface 104, and to control the timing of shock waves induced by the impact relative to the high-stress thermally deformed shapes 32 and 36 shown in FIG. 2. In alternative embodiments, controlling may include avoiding contact entirely, although at least some contact between the outer perimeter and the support plate may be desirable for many embodiments, to reduce overall workpiece motion, thereby improving survivability. Thus, such control advantageously reduces the risk of damage to or breakage of the workpiece resulting from a collision between the workpiece and the support plate.

Also in this embodiment, supporting the workpiece 106 includes supporting the thermally deformed shape of the workpiece 106 above the upper surface 104 of the support plate 102 by a distance sufficiently small that gas pressure between the upper surface 104 and the thermally deformed shape of the workpiece 106 opposes thermally induced motion of the workpiece. Thus, the gas pressure between the support plate 102 and the workpiece 106 serves to dampen vibratory motion of the workpiece, thereby further reducing the likelihood of damage to or breakage of the workpiece.

Referring to FIGS. 1-14, in various illustrative embodiments, each of the apparatuses 10, 40, 100, 200, 300, 400, 500, 600, 700, 800 and 900 may include its own heat-treating system, which may be either similar to or substantially different from the illustrative heat-treating system 1052 shown in FIG. 14. Conversely, in alternative embodiments, each of these apparatuses may include only support plate components for installation in existing heat-treating systems.

Figure 15:
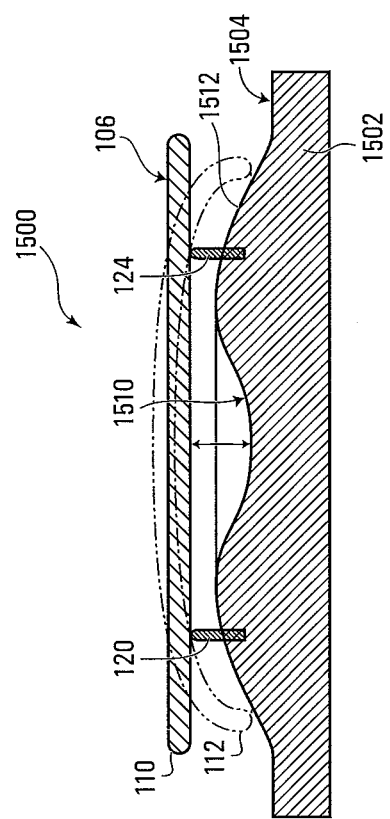
FIG. 15 is a central cross-section of an apparatus for supporting a workpiece according to a thirteenth embodiment of the invention.

Referring to FIGS. 5 and 15, an apparatus for supporting a workpiece during heat-treating according to a thirteenth embodiment of the invention is shown generally at 1500. The apparatus 1500 includes a support plate 1502 having a non-planar upper surface shown generally at 1504, and a support system (not shown in FIG. 15). Generally, the support plate 1502 is similar to that shown at 102 in FIG. 5. Unlike the support plate 102, however, in this embodiment an inner region 1510 of the upper surface 1504 of the support plate 1502 is generally concave, and an outer region 1512 of the upper surface 1504 of the support plate 1502 is generally convex.

More particularly, in this embodiment the upper surface 1504 of the support plate 1502 has a recessed concave portion centered about the central axis of the workpiece, defining the inner region 1510. In this embodiment, the recessed concave inner region 1510 extends outward from the central axis of the workpiece to about two-thirds of the radius of the workpiece (to about r=100 mm), at which radial distance the upper surface 1504 transitions from the generally concave inner region 1510 to the generally convex outer region 1512.

Other Alternatives

Although specific upper surface shapes of support plates have been described herein for illustrative purposes, numerous other possible shapes will be apparent to one of ordinary skill in the art upon reviewing the present specification. Thus, any alternative upper surface shape, at least a substantial portion of which is non-planar, may be substituted for any of the upper surface shapes described herein, as appropriate for a particular embodiment or application.

Similarly, although various features such as gas flow barriers, contact portions and support pins have been shown in conjunction with specific illustrative upper surface shapes of support plates, alternatively, such features may be omitted from other embodiments employing these upper surface shapes.

Although various features described herein have been described in separate embodiments, many of these features are not mutually exclusive and may be combined with or substituted for each other in various alternative embodiments.

For example, referring back to FIG. 8, the contact portion 406 may be provided in any of the other embodiments described herein, or in other embodiments not shown.

Similarly, referring to FIGS. 5 and 9, support pins such as those shown in FIG. 1 may be substituted for those shown in FIGS. 9-13 or vice versa. More generally, support pins such as those shown in FIG. 5 or the alternative pins shown in FIG. 9 may be substituted for the specific support pins shown in any other embodiment herein. Alternatively, other types of support pins not specifically described herein may be substituted. More generally, different means for supporting the workpiece may be substituted. For example, flexible support members, such as the quartz fiber loops of the support system 15 shown in FIGS. 1 and 4 or any of the other flexible support members disclosed in commonly owned U.S. patent application no. US 2004/0178553, for example, may be substituted for the support pins of any of the other embodiments. Likewise, the locations at which the support pins or other support means are disposed may be altered as appropriate for a particular embodiment.

Likewise, referring to FIGS. 9-13, gas flow barriers such as the turbulence generators shown in FIGS. 9-13 may be provided in any of the embodiments shown herein.

Referring to FIG. 13, upper portions having any of the upper surfaces herein may be added, substituted or removed from any given combination of one or more lower portions and one or more upper portions. More generally, any other suitable alternative upper portion having an upper surface at least a substantial portion of which is non-planar may be added or substituted.

More generally still, while specific embodiments of the invention have been described and illustrated, such embodiments should be considered illustrative of the invention only and not as limiting the invention as construed in accordance with any claims that may accompany this application or an application claiming priority from it.

What is claimed is:

1. An apparatus for supporting a workpiece during heat-treating thereof, the apparatus comprising:
    a support plate having a non-planar upper surface; and
    a support system configured to support the workpiece above the support plate during heat-treating of the workpiece, such that a lower surface of an initial shape of the workpiece is supported at a non-uniform spacing above the non-planar upper surface of the support plate, said non-uniform spacing including an edge gap beneath an outer perimeter of the workpiece, and a central gap at a central axis of the workpiece;
    wherein the non-planar upper surface of the support plate has a shape complementary to an expected thermally deformed shape of the workpiece.

2. The apparatus of claim 1, wherein the edge gap is in the range of about $3 \times 10^{-4}$ m to about $1.2 \times 10^{-3}$ m.

3. The apparatus of claim 2 wherein the edge gap is about one-half millimeter.

4. The apparatus of claim 1 wherein the central gap is in the range of about $1.2 \times 10^{-3}$ m to about $2.5 \times 10^{-3}$ m.

5. The apparatus of claim 1 wherein the support system comprises a plurality of flexible support members.

6. The apparatus of claim 5 wherein the plurality of flexible support members comprises a plurality of quartz fibers.

7. The apparatus of claim 1 wherein the support system comprises a plurality of support pins.

8. The apparatus of claim 1 wherein the edge gap and the central gap are unequal.

9. The apparatus of claim 1 wherein the edge gap is larger than the central gap.

10. The apparatus of claim 1 wherein the edge gap is at least twice as large as the central gap.

11. The apparatus of claim 1 wherein the non-uniform spacing minimizes spatial variations in heat loss rates across the workpiece when an expected non-uniform temperature distribution exists in the support plate.

12. The apparatus of claim 1 wherein the non-uniform spacing generally varies as a non-decreasing function of the radial distance.

13. The apparatus of claim 1 wherein the non-uniform spacing is substantially constant at less than a threshold radial distance from the central axis of the workpiece and wherein the non-uniform spacing generally increases as a function of radial distance from the threshold radial distance to a radius of the workpiece.

14. The apparatus of claim 1 wherein the central gap is less than or equal to about one millimeter and the edge gap is more than about two millimeters.

15. The apparatus of claim 1 wherein at least some of the upper surface of the support plate is generally dome-shaped.

16. The apparatus of claim 1 wherein at least some of the upper surface of the support plate is generally saucer-shaped.

17. The apparatus of claim 1 wherein at least some of the upper surface of the support plate is generally frustoconical-shaped.

18. The apparatus of claim 1 wherein an inner region of the upper surface of the support plate is generally concave, and wherein an outer region of the upper surface of the support plate is generally convex.

19. The apparatus of claim 1 wherein the upper surface of the support plate is configured to be spaced from the expected thermally deformed shape of the workpiece by a distance sufficiently small that gas pressure between the upper surface and the expected thermally deformed shape of the workpiece opposes thermally induced motion of the workpiece.

20. The apparatus of claim 19 wherein the upper surface of the support plate is configured to be spaced from the expected thermally deformed shape of the workpiece by a distance on the order of one millimeter.

21. The apparatus of claim 1 wherein the support plate comprises a gas flow barrier configured to resist gas flow through a gap between the upper surface and the workpiece when the workpiece is supported above the support plate.

22. The apparatus of claim 21 wherein the gas flow barrier comprises a turbulence generator.

23. The apparatus of claim 22 wherein the turbulence generator comprises an annular channel defined in the upper surface of the support plate.

24. The apparatus of claim 1 wherein the edge gap and the central gap are adjustable.

25. The apparatus of claim 1 wherein the support plate comprises a lensing portion configured to provide a desired lensing effect to electromagnetic radiation being transmitted through the support plate to the workpiece.

26. The apparatus of claim 1 further comprising a heat-treating system configured to thermally induce motion of the workpiece.

27. The apparatus of claim 26 wherein the heat-treating system is configured to pre-heat the workpiece to an intermediate temperature, and is configured to heat only a surface region of the workpiece to a desired temperature greater than the intermediate temperature in less than a thermal conduction time of the workpiece.

28. An apparatus for supporting a workpiece during heat-treating thereof, the apparatus comprising:
    a support plate having a non-planar upper surface; and
    a support system configured to support the workpiece above the support plate during heat-treating of the workpiece, such that a lower surface of an initial shape of the workpiece is supported at a non-uniform spacing above the non-planar upper surface of the support plate, said non-uniform spacing including an edge gap beneath an outer perimeter of the workpiece, and a central gap at a central axis of the workpiece;
    wherein the upper surface of the support plate extends outwardly and downwardly, from the central axis to the outer perimeter of the workpiece.

29. The apparatus of claim 1 wherein the upper surface of the support plate comprises a contact portion configured to be struck by an outer perimeter of the workpiece during heat-treating thereof.

30. An apparatus for supporting a workpiece during heat-treating thereof, the apparatus comprising:
a support plate having a non-planar upper surface; and
a support system configured to support the workpiece above the support plate during heat-treating of the workpiece, such that a lower surface of an initial shape of the workpiece is supported at a non-uniform spacing above the non-planar upper surface of the support plate, said non-uniform spacing including an edge gap beneath an outer perimeter of the workpiece, and a central gap at a central axis of the workpiece;
wherein the upper surface of the support plate comprises a contact portion configured to be struck by an outer perimeter of the workpiece during heat-treating thereof; and
wherein the contact portion is configured to apply a reaction force having a radially inward component to the outer perimeter of the workpiece in reaction to the outer perimeter of the workpiece striking the contact portion.

31. An apparatus for supporting a workpiece during heat-treating thereof, the apparatus comprising:
a support plate having a non-planar upper surface; and
a support system configured to support the workpiece above the support plate during heat-treating of the workpiece, such that a lower surface of an initial shape of the workpiece is supported at a non-uniform spacing above the non-planar upper surface of the support plate, said non-uniform spacing including an edge gap beneath an outer perimeter of the workpiece, and a central gap at a central axis of the workpiece;
wherein the upper surface of the support plate comprises a contact portion configured to be struck by an outer perimeter of the workpiece during heat-treating thereof; and
wherein the contact portion is angled relative to an adjacent inward portion of the upper surface.

32. An apparatus for supporting a workpiece during heat-treating thereof, the apparatus comprising:
a support plate having a non-planar upper surface; and
a support system configured to support the workpiece above the support plate during heat-treating of the workpiece, such that a lower surface of an initial shape of the workpiece is supported at a non-uniform spacing above the non-planar upper surface of the support plate, said non-uniform spacing including an edge gap beneath an outer perimeter of the workpiece, and a central gap at a central axis of the workpiece;
wherein the support plate comprises a removable portion comprising at least some of the upper surface of the support plate.

33. The apparatus of claim 32 wherein the support plate comprises a lower portion and an upper portion, and wherein the removable portion comprises the upper portion.

34. The apparatus of claim 33 further comprising a second upper portion having a differently shaped upper surface, and wherein the second upper portion is interchangeable with the upper portion to change a shape of the upper surface of the support plate.

35. The apparatus of claim 33 further comprising a plurality of upper portions each having a uniquely shaped upper surface, and wherein each of the plurality of upper portions is interchangeable with the upper portion to change a shape of the upper surface of the support plate.

36. The apparatus of claim 32 wherein the removable portion comprises a removable edge portion and a removable central portion.

37. An apparatus for supporting a workpiece during heat-treating thereof, the apparatus comprising:
a support plate having a non-planar upper surface;
a support system configured to support the workpiece above the support plate during heat-treating of the workpiece, such that a lower surface of an initial shape of the workpiece is supported at a non-uniform spacing above the non-planar upper surface of the support plate, said non-uniform spacing including an edge gap beneath an outer perimeter of the workpiece, and a central gap at a central axis of the workpiece; and
a second plate disposed above a plane at which the apparatus is configured to support the initial shape of the workpiece.

38. A method comprising:
supporting a workpiece above a non-planar upper surface of a support plate during heat-treating of the workpiece, such that a lower surface of an initial shape of the workpiece is supported at a non-uniform spacing above the non-planar upper surface of the support plate, said non-uniform spacing including an edge gap beneath an outer perimeter of the workpiece, and a central gap at a central axis of the workpiece, and the non-planar upper surface of the support plate has a shape complementary to an expected thermally deformed shape of the workpiece.

39. The method of claim 38, wherein the edge gap is in the range of about $3 \times 10^{-4}$ m to about $1.2 \times 10^{-3}$ m.

40. The method of claim 38 wherein the central gap is in the range of about $1.2 \times 10^{-3}$ m to about $2.5 \times 10^{-3}$ m.

41. The method of claim 38 wherein supporting comprises supporting the workpiece with a plurality of quartz fibers.

42. The method of claim 38 wherein supporting comprises supporting the workpiece while heat-treating the workpiece, and wherein heat-treating the workpiece comprises thermally inducing motion of the workpiece.

43. The method of claim 42 wherein thermally inducing motion of the workpiece comprises heating only a surface region of the workpiece to a desired temperature in less than a thermal conduction time of the workpiece, thereby deforming the workpiece from the initial shape to a thermally deformed shape.

44. The method of claim 43 wherein supporting comprises supporting the thermally deformed shape of the workpiece above the upper surface of the support plate by a distance sufficiently small that gas pressure between the upper surface and the thermally deformed shape of the workpiece opposes thermally induced motion of the workpiece.

45. The method of claim 38 wherein the non-uniform spacing minimizes spatial variations in heat loss rates across the workpiece when an expected non-uniform temperature distribution exists in the support plate.

* * * * *